US012615055B2

(12) United States Patent
Kim

(10) Patent No.: US 12,615,055 B2
(45) Date of Patent: Apr. 28, 2026

(54) ANALOG-TO-DIGITAL CONVERTER CIRCUIT FOR MASKING A SYSTEM CLOCK SIGNAL AND AN IMAGE SENSOR INCLUDING THE SAME

(71) Applicant: SAMSUNG ELECTRONICS CO., LTD., Suwon-si (KR)

(72) Inventor: Sungyong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/950,965

(22) Filed: Nov. 18, 2024

(65) Prior Publication Data

US 2025/0337431 A1 Oct. 30, 2025

(30) Foreign Application Priority Data

Apr. 26, 2024 (KR) ........................ 10-2024-0055995

(51) Int. Cl.
*H03M 1/36* (2006.01)
*H04N 25/76* (2023.01)
*H04N 25/78* (2023.01)

(52) U.S. Cl.
CPC .......... *H03M 1/36* (2013.01); *H04N 25/7795* (2023.01); *H04N 25/78* (2023.01)

(58) Field of Classification Search
CPC ........ H03M 1/36; H03M 1/56; H04N 25/677; H04N 25/7795; H04N 25/78
USPC ....................................................... 348/302
See application file for complete search history.

(56) References Cited

U.S. PATENT DOCUMENTS

| | | | |
|---|---|---|---|
| 8,164,657 B2 | 4/2012 | Blanquart | |
| 8,502,899 B2 * | 8/2013 | Wakabayashi | H03M 1/0658 |
| | | | 341/155 |
| 8,606,051 B2 | 12/2013 | Wang et al. | |
| 8,743,254 B2 * | 6/2014 | Wakabayashi | H03M 1/0658 |
| | | | 348/294 |
| 8,963,759 B2 | 2/2015 | Yan | |
| 9,083,368 B2 * | 7/2015 | Kim | H04N 25/78 |
| 9,860,472 B2 | 1/2018 | Lee et al. | |
| 10,038,867 B2 | 7/2018 | Kim et al. | |

(Continued)

FOREIGN PATENT DOCUMENTS

| | | |
|---|---|---|
| JP | 2015-177528 A2 | 10/2015 |
| JP | 2022-178321 A2 | 12/2022 |
| KR | 10-1211082 B1 | 12/2012 |

*Primary Examiner* — Pritham D Prabhakher
(74) *Attorney, Agent, or Firm* — Morgan, Lewis & Bockius LLP

(57) ABSTRACT

An image sensor including: a pixel array including first to N-th pixel circuits to generate first to N-th pixel signals; an ADC connected to the pixel circuits; a system clock generator to generate a system clock signal; an internal clock generator to generate first to N-th clock signals and (N+1)-th to 2N-th clock signals based on the system clock signal; a ramp generator to generate first to N-th ramp signals based on the first to N-th clock signals; and a counter clock generator to generate first to N-th counter clock signals based on the (N+1)-th to 2N-th clock signals, the ADC includes: a comparator to generate first to N-th comparison signals based on comparison operations of the first to N-th pixel signals and the first to N-th ramp signals; and a counter to generate first to N-th digital signals based on the comparison signals and the counter clock signals.

20 Claims, 11 Drawing Sheets

(56)          References Cited

U.S. PATENT DOCUMENTS

| | | | |
|---|---|---|---|
| 10,910,026 B2 * | 2/2021 | Yoshida | G11C 7/222 |
| 11,431,925 B1 * | 8/2022 | Elsayed | H04N 25/78 |
| 11,445,142 B2 | 9/2022 | Kim | |
| 2009/0322912 A1 * | 12/2009 | Blanquart | H04N 23/71 |
| | | | 348/241 |
| 2011/0074994 A1 * | 3/2011 | Wakabayashi | H03M 1/0658 |
| | | | 348/E5.091 |
| 2012/0039548 A1 * | 2/2012 | Wang | H03M 1/1009 |
| | | | 382/312 |
| 2013/0243147 A1 * | 9/2013 | Kim | H04N 25/7795 |
| | | | 377/42 |
| 2013/0293754 A1 * | 11/2013 | Wakabayashi | H03M 1/0658 |
| | | | 348/302 |
| 2013/0300906 A1 * | 11/2013 | Yan | H03M 1/56 |
| | | | 348/302 |
| 2014/0118583 A1 * | 5/2014 | Shida | H04N 25/78 |
| | | | 348/250 |
| 2016/0205332 A1 * | 7/2016 | Lee | H04N 25/46 |
| | | | 348/241 |
| 2017/0104949 A1 * | 4/2017 | Kim | G06F 17/11 |
| 2020/0227101 A1 * | 7/2020 | Yoshida | G11C 7/222 |
| 2022/0109802 A1 * | 4/2022 | Kim | H04N 25/616 |
| 2022/0286626 A1 * | 9/2022 | Elsayed | H04N 25/78 |
| 2025/0038760 A1 * | 1/2025 | Kim | H04N 25/78 |

* cited by examiner

| PIXOUT1 | o1 | o2 | o3 | $\cdots$ |
|---|---|---|---|---|
| PIXOUT2 | o1 | o2 | o3 | $\cdots$ |
| PIXOUT3 | o1 | o2 | o3 | $\cdots$ |
| $\vdots$ | $\vdots$ | $\vdots$ | $\vdots$ | $\cdots$ |
| PIXOUTN | o1 | o2 | o3 | $\cdots$ |
| AVG | DNLA1 | DNLA2 | DNLA3 | $\cdots$ |

$$\frac{o1 \times N}{N} \quad (\text{DNL is repeated})$$

| PIXOUT1 | o1 | o2 | o3 | · · · |
|---------|-----|-----|-----|-------|
| PIXOUT2 | o2 | o3 | o4 | · · · |
| PIXOUT3 | o3 | o4 | o5 | · · · |
| ⋮ | ⋮ | ⋮ | ⋮ | · · · |
| PIXOUTN | oN | o1 | o2 | · · · |
| AVG | DNLA1 | DNLA2 | DNLA3 | · · · |

$$\frac{(o1+o2+ \ldots +oN)}{N} \quad \text{(DNLA is decresed)}$$

ANALOG-TO-DIGITAL CONVERTER CIRCUIT FOR MASKING A SYSTEM CLOCK SIGNAL AND AN IMAGE SENSOR INCLUDING THE SAME

CROSS-REFERENCE TO RELATED APPLICATION

This application claims priority under 35 U.S.C. § 119 to Korean Patent Application No. 10-2024-0055995 filed on Apr. 26, 2024, in the Korean Intellectual Property Office, the disclosure of which is incorporated by reference herein in its entirety.

TECHNICAL FIELD

Embodiments of the present disclosure described herein relate to an image sensor including an analog-to-digital converter circuit, and more particularly, to an analog-to-digital converter circuit for masking a system clock signal and an image sensor including the same.

DISCUSSION OF RELATED ART

An image sensor generates an image by capturing light through a pixel circuit's photodiode. An analog-to-digital converter circuit (ADC circuit) in the image sensor converts the analog voltage, representing the light's intensity, into a digital signal.

The ADC circuit may use a correlated double sampling (CDS) method to generate a digital signal corresponding to light intensity by counting a reset period, during which no light is detected, and a signal period, during which light is detected. However, the ADC circuit can exhibit differential non-linearity (DNL), where the range of the analog voltage corresponding to the counting result is not uniform. Because the counting results from the reset period, associated with pixel circuits in the same column, overlap, the DNL in the digital signals tends to repeat. This leads to column fixed pattern noise (CFPN) in the image sensor.

SUMMARY

Embodiments of the present disclosure provide an analog-to-digital converter (ADC) circuit for masking a system clock signal and an image sensor including the same.

According to an embodiment of the present disclosure, there is provided an image sensor including: a pixel array including first to N-th pixel circuits configured to respectively generate first to N-th pixel signals; a row decoder configured to sequentially drive the first to N-th pixel circuits; a first ADC connected to the first to N-th pixel circuits through a first column line; a system clock generator configured to generate a system clock signal; an internal clock generator configured to generate first to N-th clock signals and (N+1)-th to 2N-th clock signals based on the system clock signal; a ramp generator configured to generate first to N-th ramp signals respectively based on the first to N-th clock signals; and a counter clock generator configured to generate first to N-th counter clock signals respectively based on the (N+1)-th to 2N-th clock signals, wherein the first ADC includes: a first comparator configured to generate first to N-th comparison signals based on comparison operations of the first to N-th pixel signals and the first to N-th ramp signals; and a first counter configured to generate first to N-th digital signals based on the first to N-th comparison signals and the first to N-th counter clock signals, wherein the internal clock generator is further configured to: in synchronization with the sequential driving of the first to N-th pixel circuits by the row decoder, sequentially generate the first to N-th clock signals by masking the system clock signal respectively for first to N-th clock cycles, and sequentially generate the (N+1)-th to 2N-th clock signals that are identical to the system clock signal; or in synchronization with the sequential driving of the first to N-th pixel circuits by the row decoder, sequentially generate the first to N-th clock signals that are identical to the system clock signal, and sequentially generate the (N+1)-th to 2N-th clock signals by masking the system clock signal respectively for the first to N-th clock cycles, and wherein "N" is an integer of 2 or more.

According to an embodiment of the present disclosure, there is provided an image sensor including: a pixel array including a plurality of pixel circuits disposed at a plurality of rows and a plurality of columns; a row decoder configured to sequentially drive the plurality of rows; a system clock generator configured to generate a system clock signal; an internal clock generator configured to generate a ramp system clock signal and a counter system clock signal based on the system clock signal; a ramp generator configured to generate a ramp signal based on the ramp system clock signal; a counter clock generator configured to generate a counter clock signal based on the counter system clock signal; and a first ADC connected to pixel circuits, which are located at a first column among the plurality of columns, from among the plurality of pixel circuits through a first column line; wherein the first ADC includes: a first comparator configured to generate a comparison signal based on a comparison operation of a pixel signal received through the first column line and the ramp signal; and a first counter configured to generate a digital signal based on the comparison signal and the counter clock signal, wherein the internal clock generator is configured to: generate the ramp system clock signal by masking the system clock signal for a target clock cycle and generate the counter system clock signal that is identical to the system clock signal; or generate the ramp system clock signal that is identical to the system clock signal and generate the counter system clock signal by masking the system clock signal for the target clock cycle, and wherein the target clock cycle changes each time a row driven by the row decoder from the plurality of rows, changes.

According to an embodiment of the present disclosure, there is provided an ADC circuit which is connected to first to N-th pixel circuits and a system clock generator, including: an internal clock generator configured to generate first to N-th clock signals and (N+1)-th to 2N-th clock signals based on a system clock signal received from the system clock generator; a ramp generator configured to generate first to N-th ramp signals respectively based on the first to N-th clock signals; a counter clock generator configured to generate first to N-th counter clock signals respectively based on the (N+1)-th to 2N-th clock signals; and a first ADC connected to the first to N-th pixel circuits through a first column line, wherein the first ADC includes: a first comparator configured to generate first to N-th comparison signals based on comparison operations of first to N-th pixel signals respectively received from the first to N-th pixel circuits and the first to N-th ramp signals; and a first counter configured to generate first to N-th digital signals based on the first to N-th comparison signals and the first to N-th counter clock signals, wherein the internal clock generator is further configured to: in synchronization with the sequential driving of the first to N-th pixel circuits, sequentially generate the first to N-th clock signals by masking the system clock signal respectively for first to N-th clock cycles and sequentially generate the (N+1)-th to 2N-th clock signals that are identical to the system clock signal; or in synchronization with the sequential driving of the first to N-th pixel circuits, sequentially generate the first to N-th clock signals that are identical to the system clock signal and sequentially generate the (N+1)-th to 2N-th clock signals by masking the system clock signal respectively for the first to N-th clock cycles, and wherein "N" is an integer greater than or equal to 2.

BRIEF DESCRIPTION OF THE DRAWINGS

The above and other features of the present disclosure will become more apparent by describing in detail embodiments thereof with reference to the accompanying drawings.

FIG. 10 is a timing diagram for describing a counter clock signal and a ramp signal of an image sensor including an internal clock generator of FIG. 9.

FIG. 12 is a table for describing a DNL average of an ADC circuit according to some embodiments of the present disclosure.

DETAILED DESCRIPTION OF THE EMBODIMENTS

The following sections describe embodiments of the present disclosure in detail and with sufficient clarity to enable those skilled in the art to implement them easily.

Figure 1:
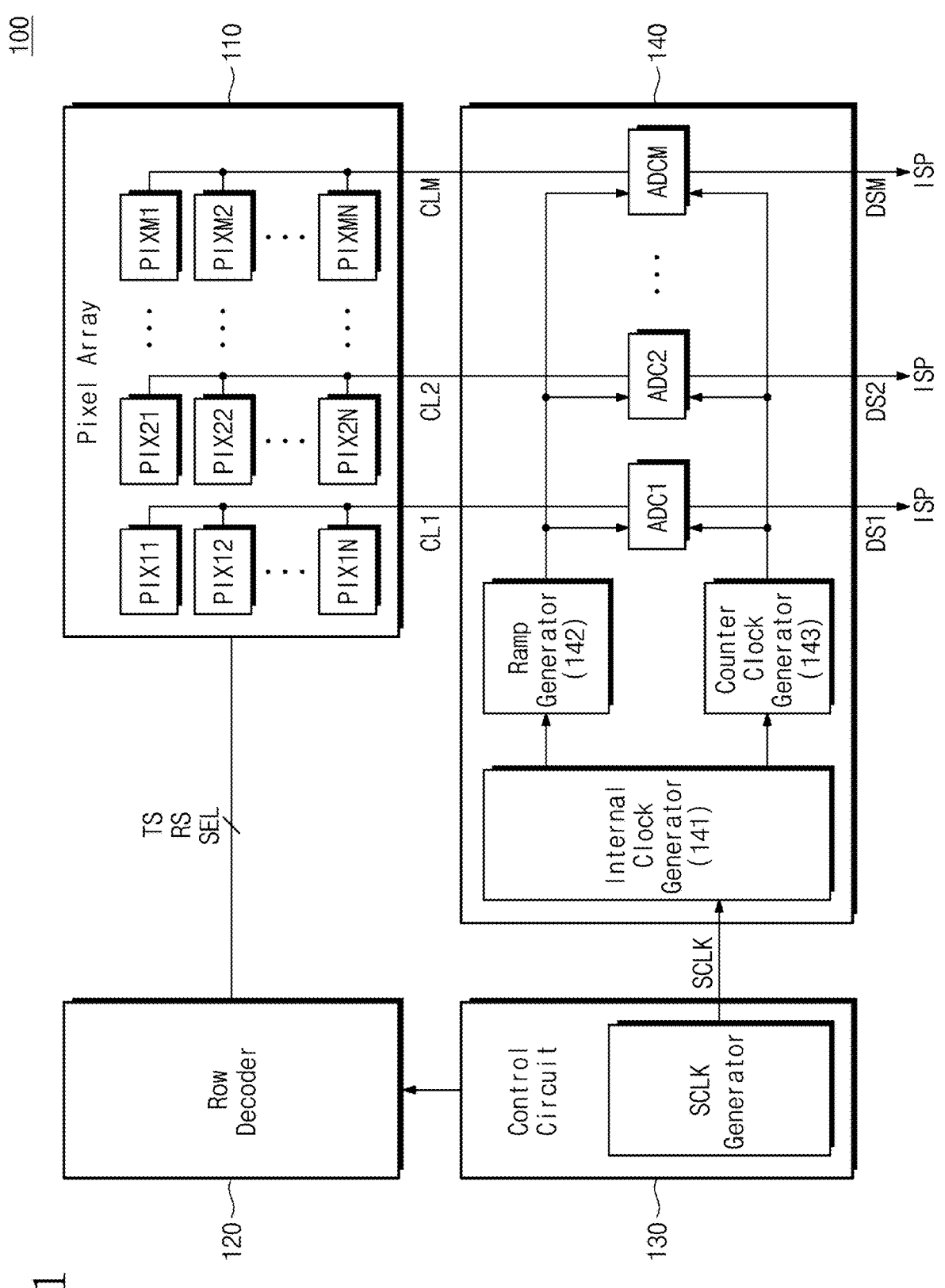
FIG. 1 is a block diagram of an image sensor according to some embodiments of the present disclosure.

FIG. 1 is a block diagram of an image sensor according to some embodiments of the present disclosure. An image sensor 100 is illustrated in FIG. 1. The image sensor 100 may include a pixel array 110, a row decoder 120, a control circuit 130, and an analog-to-digital converter (ADC) circuit 140.

The pixel array 110 may include a plurality of pixel circuits PIX11 to PIXMN and may be in the form of a matrix including a plurality of pixel rows and a plurality of pixel columns. For example, the plurality of pixel circuits PIX11 to PIXMN of the pixel array 110 may be disposed in the form of a matrix with first to N-th rows and first to M-th columns. In an embodiment, each of "M" and "N" may be an integer of 2 or more.

Pixel circuits located at the same column may be connected to the same column line CL. For example, the pixel circuits PIX11 to PIX1N located at the first column may be connected to a first column line CL1. The pixel circuits PIX21 to PIX2N located at the second column may be connected to a second column line CL2. The pixel circuits PIXM1 to PIXMN located at the M-th column may be connected to an M-th column line CLM. Pixel circuits and column lines located at the third to (M−1)-th columns are not illustrated in FIG. 1 but may have a connection relationship similar to that described above. For example, the pixel circuits in the third column may be connected to a third column line.

The plurality of pixel circuits PIX11 to PIXMN may convert a light received from the outside into electrical signals (e.g., pixel signals) in response to various control signals (e.g., a transfer signal TS, a reset signal RS, or a selection signal SEL) received from the row decoder 120. The plurality of pixel circuits PIX11 to PIXMN may output the converted electrical signals to the plurality of column lines CL1 to CLM. In an embodiment, a row refers to a pixel row where a plurality of pixel circuits are arranged, and a column refers to a pixel column where a plurality of pixel circuits are arranged. The row decoder 120 may generate a plurality of control signals for controlling the plurality of pixel circuits PIX11 to PIXMN included in the pixel array 110. For example, the row decoder 120 may generate the selection signal SEL for selecting pixel circuits belonging to a selected row from among the plurality of pixel circuits PIX11 to PIXMN, the transfer signal RS for transferring charges to a floating diffusion node in each pixel circuit of the selected row, and the reset signal RS for resetting the pixel circuits of the selected row. The row decoder 120 may provide the generated various control signals to the plurality of pixel circuits PIX11 to PIXMN.

In some embodiments, the row decoder 120 may sequentially select (or drive) a plurality of rows of the pixel array 110. For example, the row decoder 120 may generate control signals such that the first to N-th rows are sequentially driven, and thus, the pixel array 110 may sequentially output the first to N-th pixel signals respectively corresponding to the first to N-th rows.

In some embodiments, the row decoder 120 may change the row to-be-driven in the pixel array 110 at each reference driving time. The reference driving time refers to the period during which one of the plurality of rows of the pixel array 110 is driven. The reference driving time may be determined in advance. For example, under control of the control circuit 130, the row decoder 120 may drive the first row PIX11 to PIXM1 among the plurality of rows of the pixel array 110 during a first reference driving time. During a second reference driving time after the first reference driving time, the row decoder 120 may drive the second row PIX12 to PIXM2 among the plurality of rows. Afterwards, during a third reference driving time, the row decoder 120 may drive the third row PIX13 to PIXM3 among the plurality of rows.

The control circuit 130 may control the row decoder 120 and the ADC circuit 140 such that an image of the outside is captured through the pixel array 110. The control circuit 130 may include a system clock generator. For example, the system clock generator may be a phase locked loop (PLL). A system clock signal SCLK may be the fastest clock signal used by the image sensor 100 (e.g., the clock signal with the highest frequency). The system clock generator may provide the system clock signal SCLK to the ADC circuit 140.

The ADC circuit 140 may include an internal clock generator 141, a ramp generator 142, a counter clock generator 143, and first to M-th ADCs (ADC1 to ADCM). The first to M-th ADCs may respectively correspond to the first to M-th column lines CL1 to CLM, and each of the first to M-th ADCs may be connected to the pixel array 110 through the corresponding one of the first to M-th column lines CL1 to CLM.

The internal clock generator 141 may receive the system clock signal SCLK from the system clock generator of the control circuit 130. The internal clock generator 141 may generate a ramp system clock signal and a counter system clock signal, based on the system clock signal SCLK. The ramp system clock signal may be the fastest clock signal among clock signals which are based on the operation of the ramp generator 142. In other words, the ramp system clock signal may be the fastest clock signal generated by the ramp generator 142. The counter system clock signal may be the fastest clock signal among clock signals which are based on the operation of the counter clock generator 143. In other words, the counter system clock signal may be the fastest clock signal generated by the counter clock generator 143. The frequency of the ramp system clock signal and the counter system clock signal may be the same as the frequency of the system clock signal SCLK.

In detail, the internal clock generator 141 may mask the system clock signal SCLK for a target clock cycle to output it as either the ramp system clock signal or the counter system clock signal, while outputting the unmodified system clock signal SCLK as the other. The target clock cycle may change whenever the row decoder 120 drives a different row of the pixel array 110.

For example, with regard to the first to N-th rows of the pixel array 110, target clock cycles corresponding to the first to N-th rows may be respectively referred to as "first to N-th clock cycles". In detail, when the row decoder 120 drives the first row among the first to N-th rows (e.g., drives the first pixel circuit PIX11), the target clock cycle may be referred to as a "first clock cycle". When the row decoder 120 drives the second row (e.g., drives the second pixel circuit PIX12), the target clock cycle may be referred to as a "second clock cycle". In other words, whenever the row driven by the row decoder 120 changes, the internal clock generator 141 may sequentially adjust the target clock cycle, masking the system clock signal SCLK from the first to N-th clock cycles.

That is, the internal clock generator 141 may be configured to sequentially mask the system clock signal SCLK for the "first to N-th clock cycles" in synchronization with the row decoder 120 as it sequentially drives the first to N-th pixel circuits PIX11 to PIX1N located at the first column.

In some embodiments, the target clock cycle may be an integer multiple of the system clock signal SCLK cycle, and this multiple is not negative. For example, if the target clock cycle is twice the system clock signal SCLK cycle, the internal clock generator 141 may mask the system clock signal SCLK for two clock cycles of the system clock signal SCLK.

The process in which the internal clock generator 141 masks a portion of the system clock signal SCLK may be referred to as a "shift operation" (as the system clock signal SCLK has a uniform period). In other words, the internal clock generator 141 may shift the system clock signal SCLK as much as the length of the target clock cycle.

The internal clock generator 141 may provide the ramp system clock signal to the ramp generator 142. The internal clock generator 141 may provide the counter system clock signal to the counter clock generator 143.

The ramp generator 142 may receive the ramp system clock signal from the internal clock generator 141. The ramp generator 142 may generate a ramp signal based on the ramp system clock signal. The ramp signal may indicate a signal including at least one interval in which a signal level linearly increases or decreases. In other words, the ramp signal refers to a signal that includes at least one interval where the signal level increases or decreases linearly. The ramp generator 142 may generate the ramp signal depending on pre-determined values (e.g., a period start point, a period end point, a start level, an end level, and a slope). The ramp signal will be described in detail with reference to FIG. 3. The ramp generator 142 may provide the ramp signal to each of the first to M-th ADCs.

The counter clock generator 143 may receive the counter system clock signal from the internal clock generator 141. The counter clock generator 143 may generate a counter clock signal based on the counter system clock signal. The counter clock signal may be a signal which has a uniform cycle (or frequency) during an interval in which the synchronization with the ramp signal is made. In other words, the counter clock signal may be a signal with a uniform cycle (or frequency) during the interval when it is synchronized with the ramp signal. This will be described in detail with reference to FIG. 3.

Clock pulses of the counter clock signal may correspond to one of binary codes (or gray codes). The counter clock generator 143 may provide the counter clock signal to each of the first to M-th ADCs.

Each of the first to M-th ADCs may include a comparator and a counter. For example, the first ADC may include a first comparator and a first counter, and the second ADC may include a second comparator and a second counter.

The first comparator may generate a comparison signal based on a comparison operation of the pixel signal received through the first column line CL1 and the ramp signal received from the ramp generator 142.

In some embodiments, the ramp signal may include an interval where a signal level linearly decreases. In this case, the first comparator may generate a first comparison signal which has a first voltage level (e.g., a high voltage level) in an interval where the pixel signal exceeds the ramp signal, and has a second voltage level (e.g., a low voltage level) in an interval where the pixel signal is smaller than or equal to the ramp signal.

In some embodiments, the ramp signal may include an interval where a signal level linearly increases. In this case, the first comparator may generate the first comparison signal which has the second voltage level (e.g., a low voltage level) in an interval where the pixel signal exceeds the ramp signal, and has the first voltage level (e.g., a high voltage level) in an interval where the pixel signal is smaller or than or equal to the ramp signal. For convenience of description, hereinafter, the case where the ramp signal includes an interval where a signal level linearly decreases will be representatively described.

The first counter may generate a first digital signal DS1 based on the first comparison signal and the counter clock signal. For example, the first counter may generate a binary code (or gray code) as the first digital signal DS1, based on the counter clock signal at the moment when the first comparison signal transitions from the second voltage level (e.g., a low voltage level) to the first voltage level (e.g., a high voltage level).

Second to M-th comparators which the second to M-th ADCs ADC2 to ADCM respectively include may respectively generate second to M-th comparison signals in a manner similar to that of the first comparator. Second to M-th counters which the second to M-th ADCs ADC2 to ADCM respectively include may respectively generate second to M-th digital signals DS2 to DSM in a manner similar to that of the first counter.

The first to M-th ADCs may provide the first to M-th digital signals DS1 to DSM to an image signal processor ISP. The image signal processor ISP may perform an image signal processing operation based on the first to M-th digital signals DS1 to DSM. For example, the image signal processor ISP may generate image data in which a resolution is improved or an error decreases, by performing filtering, correction, etc. to the first to M-th digital signals DS1 to DSM.

Figure 2:
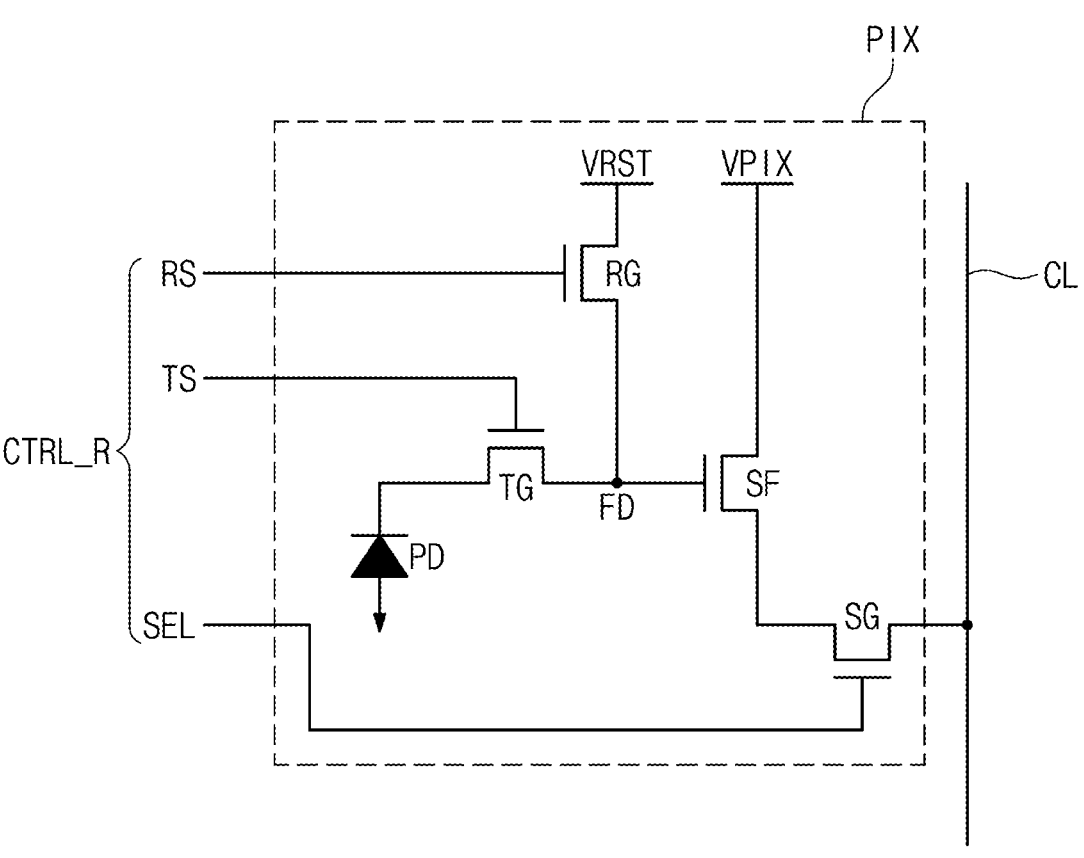
FIG. 2 is a diagram illustrating a pixel circuit included in a pixel array of FIG. 1.

FIG. 2 is a diagram illustrating the pixel circuit PIX11 included in the pixel array 110 of FIG. 1. An arbitrary pixel circuit PIX among the plurality of pixel circuits PIX11 to PIXMN included in the pixel array 110 of FIG. 1 will be described with reference to FIG. 2.

Referring to FIG. 2, a pixel circuit PIX may include a photodiode PD, a transfer gate TG, a reset gate RG, a source follower SF, and a select gate SG.

The photodiode PD may be configured to generate charges corresponding to the intensity of light incident from the outside. The transfer gate TG may be connected between the photodiode PD and a floating diffusion node FD. The transfer gate TG may transfer the charges generated by the photodiode PD to the floating diffusion node FD in response to the transfer signal TS. The reset gate RG may be connected between a reset voltage VRST and the floating diffusion node FD. The reset gate RG may reset the floating diffusion node FD with the reset voltage VRST in response to the reset signal RS. The source follower SF may be connected between a pixel voltage VPIX and the select gate SG. The source follower SF may operate in response to the level of the floating diffusion node FD. The select gate SG may be connected between the source follower SF and the column line CL. The select gate SG may operate in response to the selection signal SEL The structure of the pixel circuit PIX described with reference to FIG. 2 is provided as an example, and the present disclosure is not limited thereto. For example, the pixel circuit PIX may be implemented based on various pixel structures such as a split photodiode structure, a four-photodiode structure, and a shared pixel structure.

Figure 3:
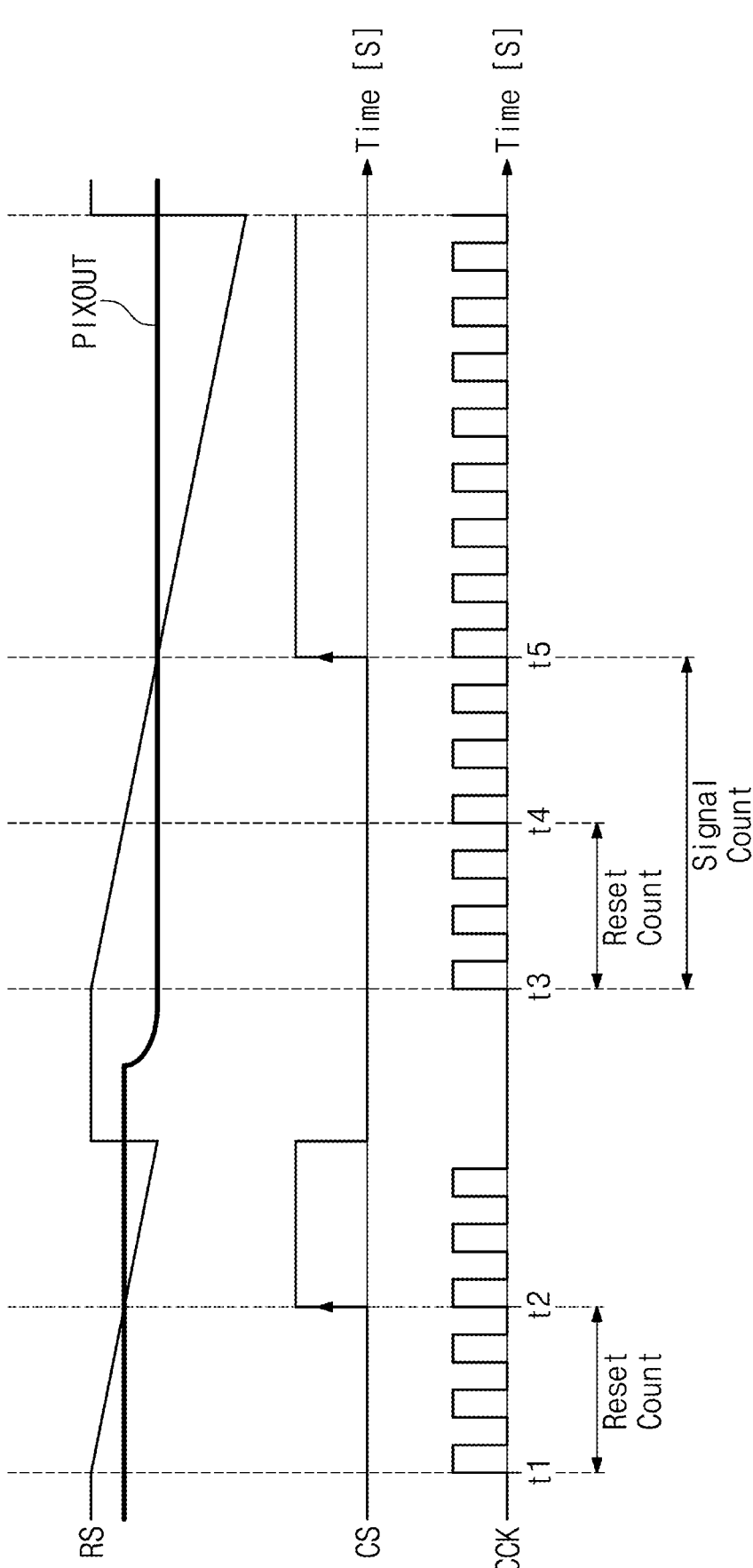
FIG. 3 is a timing diagram for describing an operation of an analog-to-digital converter (ADC) circuit.

FIG. 3 is a timing diagram for describing an operation of an analog-to-digital converter (ADC) circuit. Changes of a ramp signal RS, a comparison signal CS, and a counter clock signal CCK over time in a conventional ADC circuit will be described with reference to FIG. 3.

A conventional ADC circuit includes a ramp generator, a counter clock generator, and a plurality of ADCs.

The ramp generator may generate the ramp signal RS based on the system clock signal SCLK directly received from the system clock generator of FIG. 1, without any masking. The ramp signal RS may include two intervals in which a signal level decreases (or increases) with a uniform slope. The first interval may be referred to as a "reset interval". The reset interval refers to the interval corresponding to a pixel signal PIXOUT output by the pixel circuit when no light is received. In the reset interval, the comparator of the ADC may compare the ramp signal RS and the pixel signal PIXOUT. The second interval may be referred to as a "signal interval". The signal interval refers to the interval corresponding to the pixel signal PIXOUT output by the pixel circuit output when light is received. In the signal interval, the comparator may compare the ramp signal RS and the pixel signal PIXOUT.

For example, the ramp signal RS may correspond to the ramp signal RS which is used in the correlated double sampling (CDS) method.

The counter clock generator may generate the counter clock signal CCK based on the system clock signal SCLK directly received (e.g., being not masked) from the system clock generator of FIG. 1. The counter clock signal CCK may be a clock signal which has a uniform clock cycle in the interval where the synchronization with the ramp signal RS is made. For example, the interval where the synchronization with the ramp signal RS may include the reset interval and the signal interval. The counter clock signal CCK may have the low voltage level in the remaining interval(s).

Each of the plurality of ADCs may include a comparator and a counter. The comparator may generate the comparison signal CS based on a comparison of the ramp signal RS and the pixel signal PIXOUT. When the pixel signal PIXOUT exceeds the ramp signal RS, the comparison signal CS may have the first voltage level (e.g., a high voltage level); when the pixel signal PIXOUT is smaller than or equal to the ramp signal RS, the comparison signal CS may have the second voltage level (e.g., a low voltage level) lower than the first voltage level. The counter may generate a digital signal based on the comparison signal CS and the counter clock signal CCK.

In some embodiments, while the comparison signal CS has the second voltage level, the counter may generate the digital signal based on the number of pulses of the counter clock signal CCK.

In detail, the counter may generate the digital signal based on the difference between the first number of pulses (e.g., a signal count) of the counter clock signal CCK during the signal interval, when the comparison signal CS has the second voltage level, and the second number of pulses (e.g., a reset count) of the counter clock signal CCK during the reset interval, when the comparison signal CS has the second voltage level.

For example, as illustrated in FIG. 3, in the reset interval, the comparison signal CS has the second voltage level from a first point in time t1 to a second point in time t2, and the signal count of the counter clock signal CCK from the first point in time t1 to the second point in time t2 is "3". In the signal interval, the comparison signal CS has the second voltage level from a third point in time t3 to a fifth point in time t5, and the reset count of the counter clock signal CCK from the third point in time t3 to the fifth point in time t5 is "6". A difference of the signal count and the reset count may be "3", and the digital signal may be determined as the third code among given binary codes (or gray codes). In detail, when the ADC is of a 3-bit resolution, in other words, when the digital signal generated by the ADC is a 3-bit signal, the binary codes may sequentially correspond to "000", "001", "010", . . . , "111" whenever the number of pulses increases by one. In the above case, the counter may output "010", which is the third code, as the digital signal.

In other words, a binary code or a gray code corresponding to a difference obtained by subtracting the reset count from the first point in time t1 to the second point in time t2 from the signal count from the third point in time t3 to the fifth point in time t5. This difference is then generated as the digital signal corresponding to the pixel signal PIXOUT.

In some embodiments, the binary code (or gray code) corresponding to the reset count may be referred to as a "reset code", and the binary code (or gray code) corresponding to the signal count may be referred to as a "signal code". The ADC circuit may further include a computing circuit which stores the reset code and the signal code and calculates a difference between the signal code and the reset code. The computing circuit may output the digital signal.

Reset counts of pixel signals output from pixel circuits connected to the conventional ADC circuit operating as described above and located at the same column may be identically repeated. Accordingly, the conventional ADC circuit may output digital signals that include a non-linear error, which repeats in connection with the pixel circuits located at the same column. For example, the non-linear error may be the differential non-linearity (DNL). The DNL may vary with each reset count result. This will be described in detail with reference to FIG. 4. Accordingly, the image data generated by an image sensor with the conventional ADC circuit may include a pattern noise (e.g., a column fixed pattern noise (CFPN)). The pattern noise refers to noise that appears in the image data in a consistent pattern (e.g., in the column direction or row direction).

Figures 4, 5:
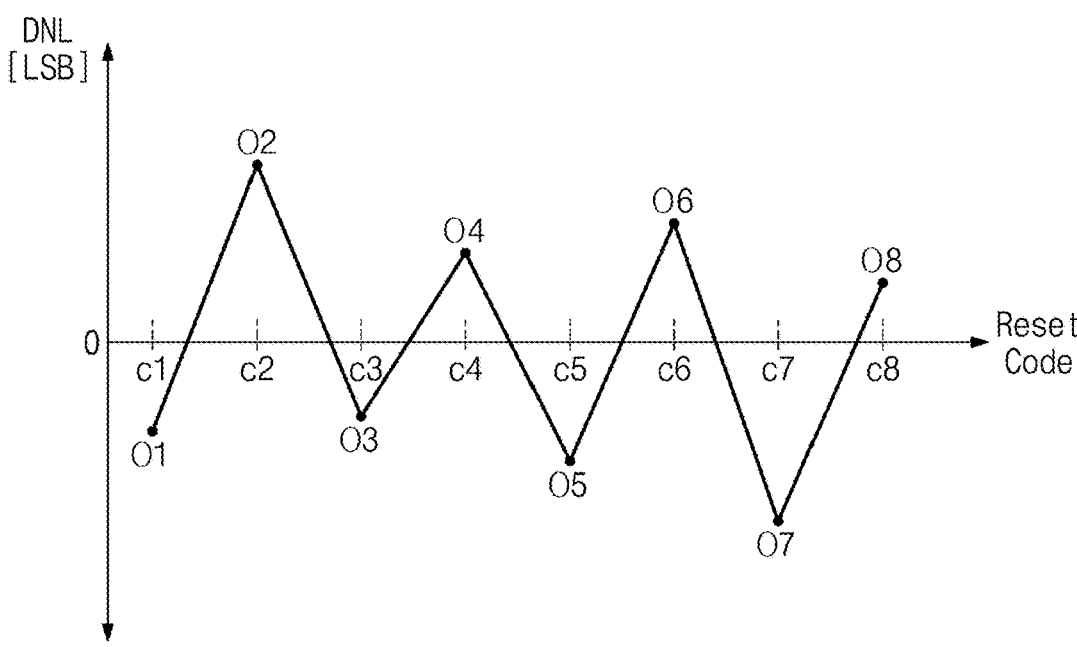
FIG. 4 is a diagram for describing differential non-linearity (DNL) of an ADC circuit.
FIG. 5 is a table for describing an average of DNLs in a conventional ADC circuit.

FIG. 4 is a diagram describing DNL of an ADC circuit. The DNL of the ADC circuit, which is caused when a digital signal includes first to third digital bits, will be described with reference to FIG. 4. The ADC circuit may correspond to the ADC circuit 140 of FIG. 1 or the conventional ADC circuit of FIG. 3. In FIG. 4, the horizontal axis represents a reset code, and the vertical axis represents the DNL.

The reset code may indicate a binary code or gray code corresponding to the reset count of FIG. 3. For example, first to eighth counter codes c1 to c8 may respectively correspond to "000", "001", "010", ..., "111" (binary codes each including three bits).

In the case of an ideal ADC circuit, analog voltage ranges respectively corresponding to reset codes may have the same magnitude (hereinafter referred to as an "ideal magnitude"). In contrast, in an actual ADC circuit (e.g., the ADC circuit 140 of FIG. 1), magnitudes of analog voltage ranges respectively corresponding to the reset codes may not be uniform. The DNL may indicate a difference (e.g., an offset) in the magnitude of each of the analog voltage ranges of the ADC circuit and the ideal magnitude. The unit of the DNL may be a least significant bit (LSB).

For example, the DNL corresponding to the first reset code c1 may be a first offset o1. The DNL corresponding to the second reset code c2 may be a second offset o2. The DNL corresponding to the third reset code c3 may be a third offset o3. The DNL corresponding to the fourth reset code c4 may be a fourth offset o4. The DNL corresponding to the fifth reset code c5 may be a fifth offset o5. The DNL corresponding to the sixth reset code c6 may be a sixth offset o6. The DNL corresponding to the seventh reset code c7 may be a seventh offset o7. The DNL corresponding to the eighth reset code c8 may be an eighth offset o8.

Each of the first offset o1, the third offset o3, the fifth offset o5, and the seventh offset o7 may be smaller than "0". Each of the second offset o2, the fourth offset o4, the sixth offset o6, and the eighth offset o8 may be greater than "0". The analog voltage range of each of reset codes where the DNL is greater than "0" may be greater than the analog voltage range of the ideal ADC. The analog voltage range of each of reset codes where the DNL is smaller than "0" may be smaller than the analog voltage range of the ideal ADC.

For example, referring to the conventional ADC of FIG. 3 together, the conventional ADC may generate a digital signal including the third offset o3, which is the DNL of the third reset code c3 corresponding to the reset count of "3". The conventional ADC may repeatedly generate the same reset counts for the pixel circuits connected to it. Accordingly, the ADC circuit may output digital signals that exhibit the same DNL for all the pixel circuits connected thereto. This may cause the CFPN. This will be described in detail with reference to FIG. 5.

For convenience of description, the ADC circuit outputting the digital bit including the first to third digital bits is described, but the present disclosure is not limited thereto. For example, the digital signal output from the ADC circuit may include four or more digital bits.

FIG. 5 is a table for describing an average of DNLs of a conventional ADC circuit. A column average DNL (DNLA) of first to N-th pixel circuits connected to one ADC of the conventional ADC circuit will be described with reference to FIG. 5. The column average DNL may indicate an average of DNLs corresponding to first to N-th pixel signals PIXOUT1 to PIXOUTN output from the first to N-th pixel circuits. For example, the DNL corresponding to the first pixel signal PIXOUT1 may indicate the DNL of the digital signal corresponding to the reset count of the first pixel signal PIXOUT1.

The first to N-th pixel circuits may be respectively located at the first to N-th rows. The first to N-th pixel circuits may be sequentially driven. In an embodiment, "N" is an integer of 2 or more.

When the DNL corresponding to the first pixel signal PIXOUT1 is the first offset o1, the DNL corresponding to each of the second to N-th pixel signals PIXOUT2 to PIXOUTN may be the first offset o1. When the DNL corresponding to the first pixel signal PIXOUT1 is the first offset o1, a first column average DNL DNLA1 may indicate an average of DNLs corresponding to the first to N-th pixel signals PIXOUT1 to PIXOUTN. Accordingly, the first column average DNL DNLA1 may be o1×N/N.

When the DNL corresponding to the first pixel signal PIXOUT1 is the second offset o2, the DNL corresponding to each of the second to N-th pixel signals PIXOUT2 to PIXOUTN may be the second offset o2. When the DNL corresponding to the first pixel signal PIXOUT1 is the second offset o2, a second column average DNL DNLA2 may indicate an average of DNLs corresponding to the first to N-th pixel signals PIXOUT1 to PIXOUTN. Accordingly, the second column average DNL DNLA2 may be o2×N/N.

When the DNL corresponding to the first pixel signal PIXOUT1 is the third offset o3, the DNL corresponding to each of the second to N-th pixel signals PIXOUT2 to PIXOUTN may be the third offset o3. When the DNL corresponding to the first pixel signal PIXOUT1 is the third offset o3, a third column average DNL DNLA3 may indicate an average of DNLs corresponding to the first to N-th pixel signals PIXOUT1 to PIXOUTN. Accordingly, the third column average DNL DNLA3 may be o3×N/N.

As described above, the DNLs corresponding to the first to N-th pixel signals PIXOUT1 to PIXOUTN may be identical to each other. In other words, the same DNL may be repeatedly included in the digital signals output from the ADC in association with the first to N-th pixel circuits. Accordingly, image data based on a digital signal output from the conventional ADC circuit may include a pattern noise due to the DNLs of the digital signals.

Figure 6:
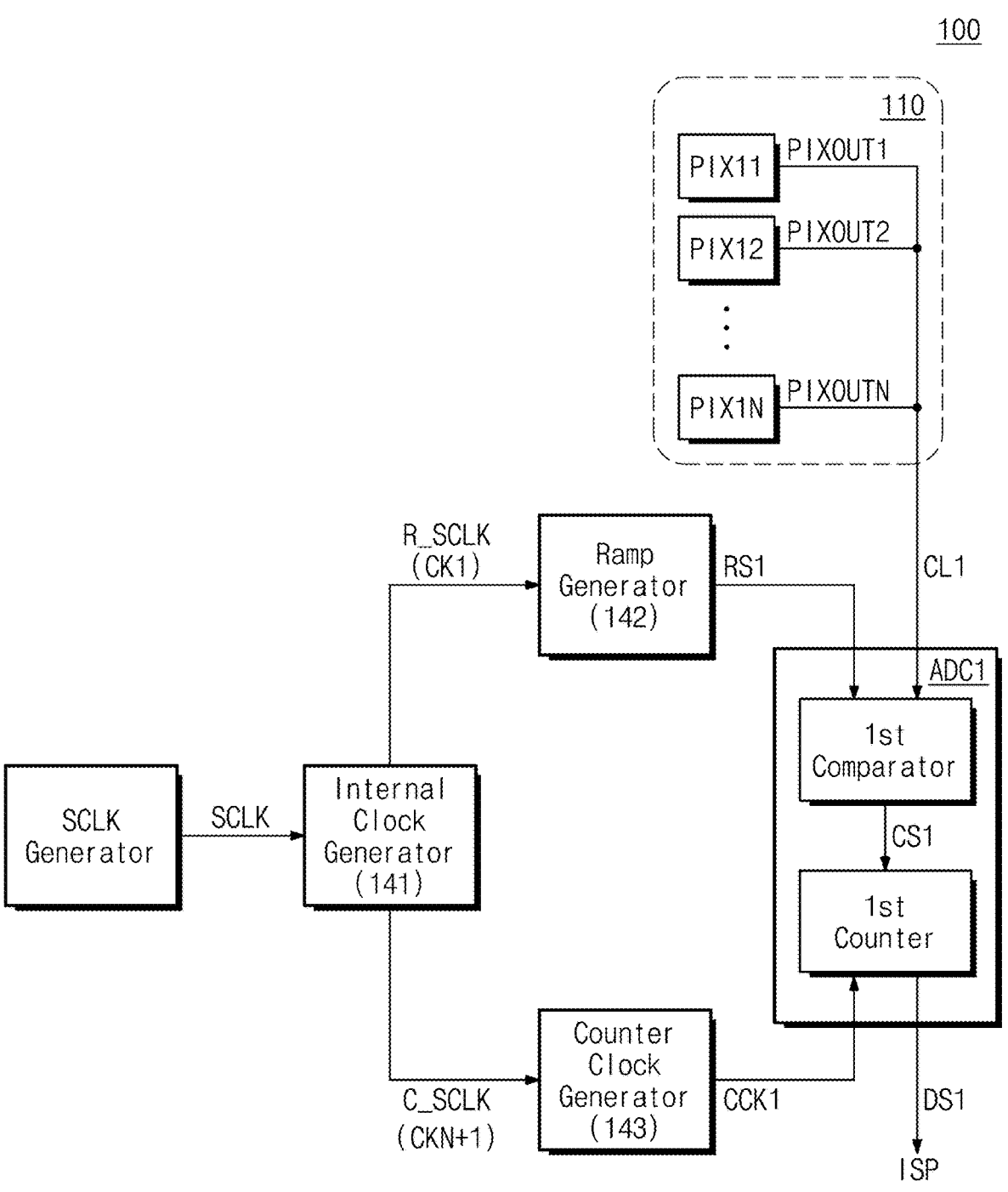
FIG. 6 is a diagram illustrating an image sensor according to some embodiments of the present disclosure in detail.

FIG. 6 is a diagram illustrating the image sensor 100 according to some embodiments of the present disclosure in detail. The image sensor 100 of FIG. 1 will be described in detail with reference to FIG. 6. The image sensor 100 includes the pixel array 110, the system clock generator, the internal clock generator 141, the ramp generator 142, the counter clock generator 143, and the first ADC1. The pixel array 110, the system clock generator, the internal clock generator 141, the ramp generator 142, the counter clock generator 143, and the first ADC1 of FIG. 6 may respectively correspond to the pixel array 110, the system clock generator, the internal clock generator 141, the ramp generator 142, the counter clock generator 143, and the first ADC1 of FIG. 1.

The pixel array 110 may include the first to N-th pixel circuits PIX11 to PIX1N. The first to N-th pixel circuits PIX11 to PIX1N may be connected to the first ADC1 through the first column line CL1. The first to N-th pixel circuits PIX11 to PIX1N may be sequentially driven by the row decoder 120 of FIG. 1. The first pixel circuit PIX11 may output the first pixel signal PIXOUT1 to the first ADC1. The second pixel circuit PIX12 may output the second pixel signal PIXOUT2 to the first ADC1. The N-th pixel circuit PIX1N may output th N-th pixel signal PIXOUTN to the first ADC1. As in the above description, the third to (N−1)-th pixel circuits may respectively output third to (N−1)-th pixel signals to the first ADC1.

The system clock generator may be included in the control circuit 130 of FIG. 1. The system clock generator may generate the system clock signal SCLK and may provide the system clock signal SCLK to the internal clock generator 141 of the ADC circuit 140.

The internal clock generator 141 may generate first to N-th clock signals and (N+1)-th to 2N-th clock signals, based on the system clock signal SCLK. The internal clock generator 141 may sequentially generate the first to N-th clock signals in synchronization with that the first to N-th pixel circuits PIX11 to PIX1N are sequentially driven by the row decoder 120 of FIG. 1. The internal clock generator 141 may provide the ramp generator 142 with the first to N-th clock signals as a ramp system clock signal R_SCLK. The internal clock generator 141 may sequentially generate the (N+1)-th to 2N-th clock signals in synchronization with the first to N-th pixel circuits PIX11 to PIX1N that are sequentially driven by the row decoder 120 of FIG. 1. The internal clock generator 141 may provide the counter clock generator 143 with the (N+1)-th to 2N-th clock signals as a counter system clock signal C_SCLK.

For example, when the first pixel circuit PIX1 is driven by the row decoder 120 of FIG. 1, the internal clock generator 141 may generate a first clock signal CK1 by masking the system clock signal SCLK for the first clock cycle and may generate a (N+1)-th clock signal CKN+1 that is the same as the system clock signal SCLK. Alternatively, the internal clock generator 141 may generate the first clock signal CK1 that is the same as the system clock signal SCLK and may generate the (N+1)-th clock signal CKN+1 by masking the system clock signal SCLK for the first clock cycle. In this case, the ramp generator 142 may generate a first ramp signal RS1 based on the first clock signal CK1, and the counter clock generator 143 may generate a first counter clock signal CCK1 based on the (N+1)-th clock signal CKN+1. The first comparator may then generate a first comparison signal CS1 based on a comparison of the first pixel signal PIXOUT1 and the first ramp signal RS1, and the first counter may generate a first digital signal DS1 based on the first comparison signal CS1 and the first counter clock signal CCK1.

In some embodiments, the first comparator may generate the first comparison signal CS1 with the first voltage level during the interval when the first pixel signal PIXOUT1 exceeds the first ramp signal RS1, and with the second voltage level lower than the first voltage level when the first pixel signal PIXOUT1 is smaller than or equal to the first ramp signal RS1.

For convenience of description, signals which are generated when the first pixel circuit PIX11 is driven by the row decoder 120 are only illustrated in FIG. 6, but the present disclosure is not limited thereto. Below, how components operate when the second pixel circuit PIX12 is driven after the first pixel circuit PIX11 is driven by the row decoder 120 will be described in detail.

For example, when the second pixel circuit PIX12 is driven by the row decoder 120 of FIG. 1, the internal clock generator 141 may generate a second clock signal CK2 by masking the system clock signal SCLK for the second clock cycle and may generate a (N+2)-th clock signal that is the same as the system clock signal SCLK. Alternatively, the internal clock generator 141 may generate the second clock signal that the same as the system clock signal SCLK and may generate the (N+2)-th clock signal by masking the system clock signal SCLK for the second clock cycle. In this case, the ramp generator 142 may generate a second ramp signal based on the second clock signal, and the counter clock generator 143 may generate a second counter clock signal based on the (N+2)-th clock signal. The first comparator may then generate a second comparison signal based on a comparison of the second pixel signal PIXOUT2 and the second ramp signal, and the first counter may generate a second digital signal DS2 based on the second comparison signal and the second counter clock signal. Operations which are performed when the third to N-th pixel circuits are sequentially driven may be similar to the above operations.

The ramp generator 142 may generate first to N-th ramp signals respectively based on the first to N-th clock signals.

The counter clock generator 143 may generate the first to N-th counter clock signals respectively based on the (N+1)-th to 2N-th clock signals.

The first ADC1 may convert the first to N-th pixel signals PIXOUT1 to PIXOUTN into first to N-th digital signals, respectively. In detail, the first ADC1 may include the first comparator and the first counter.

The first comparator may generate the first to N-th comparison signals by comparing the first to N-th pixel signals PIXOUT1 to PIXOUTN with the first to N-th ramp signals, respectively.

In detail, like the above comparison operation of the first and second pixel signals PIXOUT1 and PIXOUT2, the first comparator may generate the third to N-th comparison signals by comparing the third to N-th pixel signals with the third to N-th ramp signals, respectively.

The first counter may generate the first to N-th digital signals based on the first to N-th comparison signals and the first to N-th counter clock signals.

In some embodiments, the first counter may generate the first digital signal DS1 based on the number of pulses of the first counter clock signal CCK1 during an interval where the first comparison signal CS1 has the second voltage level.

In detail, the operations of the first comparator and the first counter are similar to those of the conventional ADC of FIG. 3. In other words, in the reset interval of FIG. 3, the number of pulses of the first counter clock signal CCK1 while the first comparison signal CS1 is at the second voltage level may correspond to the reset count of FIG. 3. In the signal interval of FIG. 3, the number of pulses of the first counter clock signal CCK1 while the first comparison signal CS1 is at the second voltage level may correspond to the signal count of FIG. 3. The first counter may generate a binary code or gray code corresponding to the difference of the signal count and the reset count as the first digital signal DS1.

In detail, the internal clock generator 141 may generate the first to N-th clock signals CK(1:N) and the (N+1)-th to 2N-th clock signals CK(N+1:2N) in two ways.

First, the internal clock generator 141 may generate the first to N-th clock signals by masking the system clock signal SCLK as according to the first to N-th clock cycles and generate the (N+1)-th to 2N-th clock signals identical to the system clock signal SCLK. Consequently, the ramp generator 142 may generate the first to N-th ramp signals by shifting the ramp signal RS of FIG. 3 as according to the first to N-th clock cycles, based on the first to N-th clock signals. The counter clock generator 143 may generate the first to N-th counter clock signals, identical to the counter clock signal CCK (refer to FIG. 3), based on the (N+1)-th to 2N-th clock signals. This will be described in detail with reference to FIGS. 7 and 8.

Alternatively, the internal clock generator 141 may generate the first to N-th clock signals identical to the system clock signal SCLK and generate the (N+1)-th to 2N-th clock signals by masking the system clock signal SCLK as according to the first to N-th clock cycles. As a result, the ramp generator 142 may generate the first to N-th ramp signals identical to the ramp signal RS of FIG. 3 based on the first to N-th clock signals. The counter clock generator 143 may generate the first to N-th counter clock signals identical to the counter clock signal CCK of FIG. 3 based on the (N+1)-th to 2N-th clock signals. This will be described in detail with reference to FIGS. 9 and 10.

In the image sensor 100 according to an embodiment of the present disclosure, the reset counts corresponding to the plurality of pixel signals PIXOUT1 to PIXOUTN respectively output from the plurality of pixel circuits PIX11 to PIX1N in the same column are not identically repeated. As a result, the digital signals output by the ADC circuit 140 may not include the same DNL repeatedly. In other words, the occurrence of pattern noise in each pixel column may decrease. This will be described in detail with reference to FIG. 12.

For convenience of description, FIG. 6 only shows the first ADC1 connected to the first column PIX11 to PIX1N of the pixel array 110 of FIG. 6, but the present disclosure is not limited thereto. A second ADC2 connected to the (N+1)-th to 2N-th pixel circuits PIX21 to PIX2N located at the second column of the pixel array 110 of FIG. 1 may also operate to be similar to the first ADC1.

In detail, the (N+1)-th to 2N-th pixel circuits PIX21 to PIX2N may output (N+1)-th to 2N-th pixel signals to the second ADC2 through the second column line CL2. A second comparator of the second ADC may generate (N+1)-th to 2N-th comparison signals based on comparison operations of the (N+1)-th to 2N-th pixel signals and the first to N-th ramp signals RS(1:N). A second counter of the second ADC2 may generate (N+1)-th to 2N-th digital signals based on the (N+1)-th to 2N-th comparison signals and the first to N-th counter clock signals.

The remaining ADCs among the first to M-th ADCs may operate similarly as described above.

Figure 7:
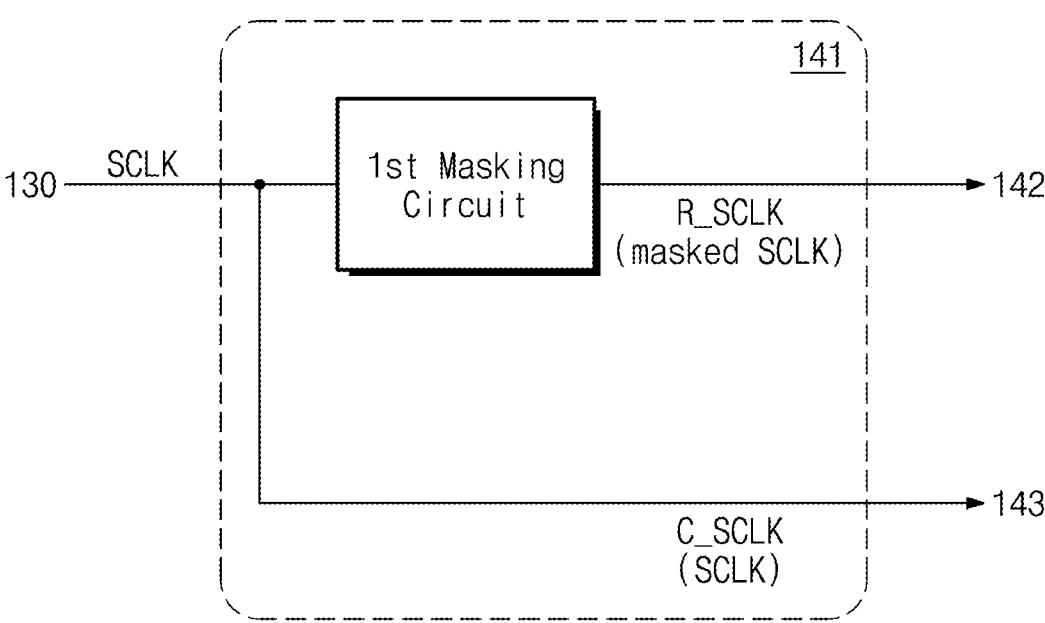
FIG. 7 is a block diagram of an internal clock generator according to some embodiments of the present disclosure.

FIG. 7 is a block diagram of the internal clock generator 141 according to some embodiments of the present disclosure. The internal clock generator 141 configured to generate the ramp system clock signal R_SCLK (e.g., the first to N-th clock signals described with reference to FIG. 6) by masking the system clock signal SCLK will be described with reference to FIG. 7.

The internal clock generator 141 may include a first masking circuit.

The first masking circuit may receive the system clock signal SCLK. The first masking circuit may generate the first to N-th clock signals by masking the system clock signal SCLK by as much as the first to N-th clock cycles. The first masking circuit may provide the first to N-th clock signals to the ramp generator 142.

In some embodiments, each of the first to N-th clock cycles may correspond to an integer multiple of the clock cycle of the system clock signal SCLK, and the integer multiple may not be negative. In other words, the first to N-th clock cycles may correspond to values obtained by multiplying first to N-th numbers by the clock cycle of the system clock signal SCLK, respectively. Each of the first to N-th numbers may be an integer that is not negative.

For example, when the first row of the pixel array 110 is driven by the row decoder 120 of FIG. 1, the first masking circuit may generate the first clock signal by masking the system clock signal SCLK for a duration equal to the product of the first number and the clock cycle of the system clock signal SCLK. Specifically, if the first number is "3," the first masking circuit may generate the first clock signal by masking the system clock signal SCLK for three clock cycles of the system clock signal SCLK.

The start point of the masked portion of the system clock signal SCLK may coincide with the start point of the system clock signal SCLK, which is synchronized for the ramp generator 142 to generate the ramp signal. Accordingly, the ramp signal generated by the ramp generator 142 may be shifted by the same amount as the portion of the system clock signal SCLK masked by the first masking circuit.

In other words, each of the first to N-th numbers may determine the number of masked clock cycles of the system clock signal SCLK and may determine the degree of shift of each of the first to N-th ramp signals.

In some embodiments, the first to N-th numbers may be determined in advance.

In some embodiments, the first masking circuit may include a logic circuit. The logic circuit may receive the system clock signal SCLK. The logic circuit may sequentially mask the system clock signal SCLK depending on the first to N-th numbers determined in advance. The logic circuit may generate the system clock signal SCLK, which is masked by adjusting the degree of buffering the system clock signal SCLK based on the first to N-th numbers, as the first to N-th clock signals.

For example, the logic circuit may include at least one flip-flop circuit or latch circuit. Alternatively, the logic circuit may include a flip-flop chain circuit. The flip-flop chain circuit may include a plurality of flip-flop circuits connected in series.

The above logic circuit may determine the first to N-th numbers in compliance with a given rule. Below, the given rule will be described in detail.

The first to N-th numbers may be determined depending on the digital signal DS which the ADC circuit 140 of FIG. 1 outputs. The digital signal DS may include first to M-th digital bits.

When "N" is smaller than 2M, the first to N-th numbers may be arbitrary (e.g., discontinuous) integers selected from the range of 0 to (2M−1) or less. For example, when "N" is 4 and "M" is 3, the first to N-th numbers may be any four integers between 0 and 7. As some examples, a set of the first to N-th numbers may be one of {0, 1, 2, 3}, {7, 5, 3, 1}, {7, 6, 1, 2}, etc.

When "N" is equal to 2M, the first to N-th numbers may correspond one-to-one with integers from 0 to (2M−1). For example, when "N" is 4 and "M" is 2, a set of the first to N-th numbers may be one of {0, 1, 2, 3}, {1, 2, 3, 0}, {3, 0, 1, 2}, etc.

When "N" is greater than 2M, the first to N-th numbers may be "N" numbers randomly distributed among the integers from 0 to (2M−1). First to 2M-th distribution numbers represent how many time each integer from 0 to (2M−1) appears among the first to N-th numbers. For example, the first distribution number may indicate the number of 0s among the first to N-th numbers. The second distribution number may indicate the number of Is among the first to N-th numbers. The 2M-th distribution number may indicate the number of (2M−1) s among the first to N-th numbers. Like in the above description, the third to (2M−1)-th distribution numbers may also be defined.

In some embodiments, a difference between two distribution numbers among the first to 2M-th distribution numbers may be smaller than 2. In other words, the first to N-th numbers may include integers from 0 to (2M−1) as uniformly as possible.

In some embodiments, the first to N-th numbers may start from "0", then sequentially increase by one, and again start from "0" when reaching (2M−1). This process may be repeated. For example, when "N" is 10 and "M" is 3, a set of the first to N-th numbers may be {0, 1, 2, 3, 4, 5, 6, 7, 0, 1}. As another example, when "N" is 20 and "M" is 3, a set of the first to N-th numbers may be {1, 2, . . . , 6, 7, 0, 1, 2, . . . , 6, 7, 0, 1, 2, 3}.

As another example, the first masking circuit may include a random number generator. The random number generator may randomly generate the first to N-th numbers each being one of integers from 0 to (2M−1). The random number generator may store the first to N-th numbers. The first masking circuit may respectively refer to the first to N-th numbers in the process of generating the first to N-th clock signals CK(1:N).

The internal clock generator 141 may sequentially generate the same counter system clock signal C_SCLK as the system clock signal SCLK (e.g., the (N+1)-th to 2N-th clock signals described with reference to FIG. 6). The internal clock generator 141 may provide the system clock signal SCLK to the counter clock generator 143 sequentially as the (N+1)-th to 2N-th clock signals without modification.

Figure 8:
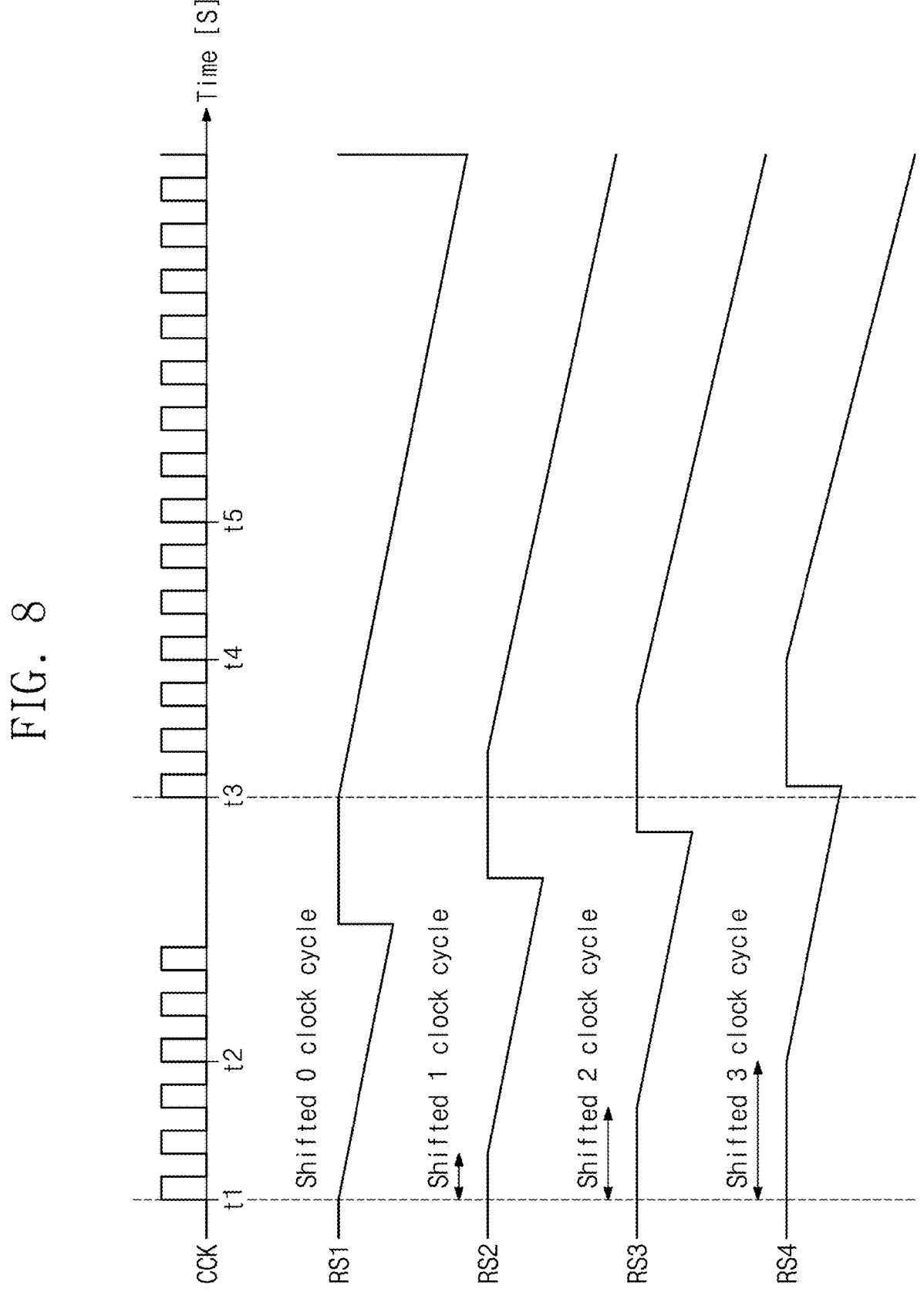
FIG. 8 is a timing diagram for describing a counter clock signal and a ramp signal of an image sensor including an internal clock generator of FIG. 7.

FIG. 8 is a timing diagram describing the counter clock signal CCK and the ramp signal RS of the counter clock signal CCK of an image sensor including the internal clock generator 141 of FIG. 7. Referring to FIG. 8, ramp signals RS1 to RS4 and the counter clock signal CCK will be described under the condition that each of the first to N-th clock signals (e.g., ramp system clock signals) is a masked system clock signal.

The counter clock signal CCK may be one of first to fourth counter clock signals. The first to fourth counter clock signals may respectively correspond to the first to fourth ramp signals RS1 to RS4.

A ramp generator may receive the first to fourth clock signals from an internal clock generator. The ramp generator may generate the first to fourth ramp signals RS1 to RS4 respectively based on the first to fourth clock signals.

For convenience of description, below, the case where a set of the first to fourth numbers respectively corresponding to the first to fourth clock signals is {0, 1, 2, 3} will be described with reference to FIG. 8.

The first ramp signal RS1 may refer to a signal that is obtained by shifting the ramp signal RS corresponding to the counter clock signal CCK of FIG. 3 by a zero clock cycle of the system clock signal (e.g., without any shift). Accordingly, as described with reference to FIG. 3, a start point of an interval where the first ramp signal RS1 uniformly decreases may be synchronized with the pulses of the counter clock signal CCK. For example, the reset count corresponding to the first pixel signal such as the pixel signal PIXOUT of FIG. 3 and the first ramp signal RS1 may be the same as the reset count of FIG. 3, in other words, may be equal to "3". Accordingly, because the DNL corresponding to the reset count of "3" is the third offset o3 in FIG. 4, the DNL corresponding to the first pixel signal may be the third offset o3.

The second ramp signal RS2 may refer to a signal that is obtained by shifting the ramp signal RS corresponding to the counter clock signal CCK of FIG. 3 by one clock cycle of the system clock signal. For example, the reset count corresponding to the second pixel signal, such as the pixel signal PIXOUT of FIG. 3 and the second ramp signal RS2, may be "4," which is greater than the reset count of FIG. 3, i.e., "3," by "1". Accordingly, because the DNL corresponding to the reset count of "4" is the fourth offset o4 in FIG. 4, the DNL corresponding to the second pixel signal may be the fourth offset o4.

The third ramp signal RS3 may refer to a signal that is obtained by shifting the ramp signal RS corresponding to the counter clock signal CCK of FIG. 3 by two clock cycles of the system clock signal. For example, the reset count corresponding to the third pixel signal, such as the pixel signal PIXOUT of FIG. 3 and the third ramp signal RS3, may be "5," which is greater than the reset count of FIG. 3, i.e., "3," "2". Accordingly, because the DNL corresponding to the reset count of "5" is the fifth offset o5 in FIG. 4, the DNL corresponding to the third pixel signal may be the fifth offset o5.

The fourth ramp signal RS4 may refer to a signal that is obtained by shifting the ramp signal RS corresponding to the counter clock signal CCK of FIG. 4 by three clock cycles of the system clock signal. For example, the reset count corresponding to the fourth pixel signal, such as the pixel signal PIXOUT of FIG. 3 and the fourth ramp signal RS4, may be "6," which is greater than the reset count of FIG. 3, i.e., "3," by "3". Accordingly, because the DNL corresponding to the reset count of "6" is the sixth offset o6 in FIG. 4, the DNL corresponding to the fourth pixel signal may be the sixth offset o6.

For convenience of description, FIG. 8 shows the first to fourth ramp signals RS1 to RS4. However, the remaining ramp signals among the first to N-th ramp signals may also be shifted in a similar manner as described above, and offsets of corresponding reset counts may be determined.

In the ADC circuit according to an embodiment of the present disclosure, as the degree of shifting the ramp signal changes each time a different pixel row is driven, the reset counts and corresponding DNLs in a single pixel column may not be identically repeated. Accordingly, pattern noise (e.g., CFPN) in the image data generated from the digital signals output from the ADC circuit may be reduced.

Figure 9:
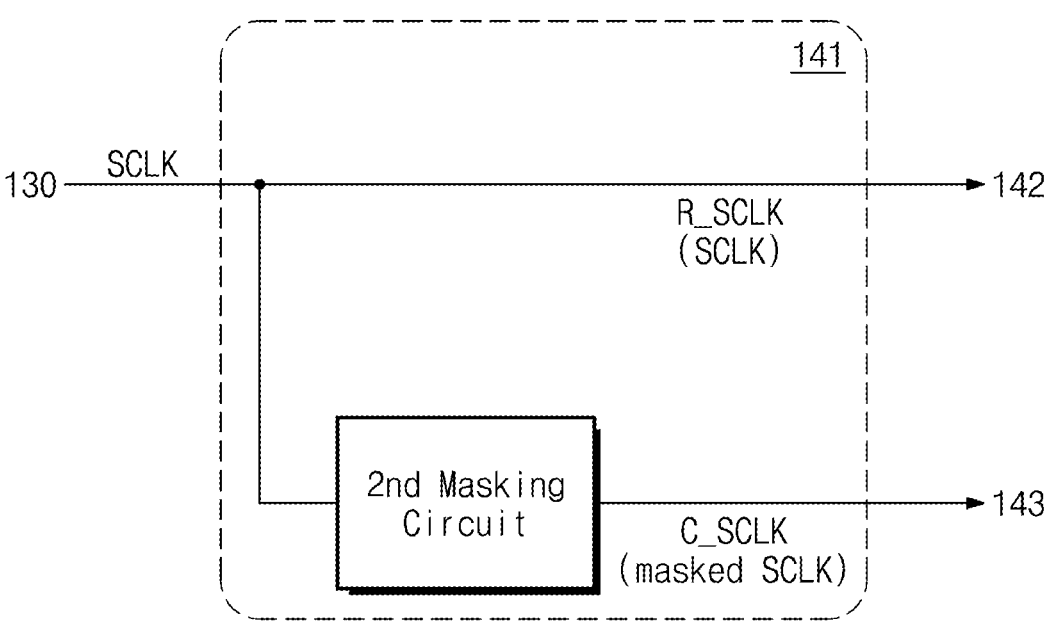
FIG. 9 is a block diagram of an internal clock generator according to some embodiments of the present disclosure.

FIG. 9 is a block diagram of an internal clock generator according to some embodiments of the present disclosure. The internal clock generator 141, which is configured to generate the counter system clock signal C_SCLK (e.g., the (N+1)-th to 2N-th clock signals described with reference to FIG. 6) by masking the system clock signal SCLK, will be described with reference to FIG. 9.

The internal clock generator 141 may include a second masking circuit. The second masking circuit may sequentially generate (N+1)-th to 2N-th clock signals based on the system clock signal SCLK, synchronized with that the sequential driving of the first to N-th pixel circuits by the row decoder 120 of FIG. 1. Additionally, the internal clock generator 141 may generate first to N-th clock signals, which are identical to the system clock signal SCLK. Except for the above description, an operation of the second masking circuit may be similar to the operation of the first masking circuit of FIG. 7. For convenience of description, in FIG. 7, the description which is the same as the description of the first masking circuit given with reference to FIG. 7 will be omitted to avoid redundancy.

The second masking circuit may receive the system clock signal SCLK. The second masking circuit may generate the (N+1)-th to 2N-th clock signals by masking the system clock signal SCLK by an amount corresponding to the first to N-th clock cycles. The second masking circuit may provide the (N+1)-th to 2N-th clock signals to the counter clock generator 143.

In some embodiments, each of the (N+1)-th to 2N-th clock cycles may correspond to an integer multiple of the clock cycle of the system clock signal SCLK, and the integer multiple may not be negative. In other words, the (N+1)-th to 2N-th clock cycles may be equivalent to values obtained by multiplying the first to N-th clock cycles by the clock cycle of the system clock signal SCLK, respectively. The description associated with the first to N-th numbers is given with reference to FIG. 7, and thus, additional description will be omitted to avoid redundancy.

For example, the second masking circuit may generate the (N+1)-th clock signal CKN+1 by masking the system clock signal SCLK by an amount equal to the product of the first number and the clock cycle of the system clock signal SCLK. In detail, if the first number is "3", the second masking circuit may generate the (N+1)-th clock signal CKN+1 by masking the system clock signal SCLK for three clock cycles of the system clock signal SCLK.

The start point of the masked portion of the system clock signal SCLK may coincide with the start point of the system clock signal SCLK, which is synchronized for the counter clock generator to produce counter clock signals. Consequently, the counter clock signal generated by the counter clock generator may be shifted by an amount corresponding to how much the system clock signal SCLK is masked by the second masking circuit.

In other words, each of the first to N-th numbers may determine the number of masked clock cycles of the system clock signal SCLK and may determine the degree of shift of each of the (N+1)-th to 2N-th counter clock signals.

In some embodiments, the first to N-th numbers may be determined in advance.

In some embodiments, like the first masking circuit, the second masking circuit may include a logic circuit or a random number generator. In other words, the second masking circuit may determine the first to N-th numbers in compliance with the given rule described with reference to FIG. 7.

The internal clock generator 141 may sequentially generate the first to N-th clock signals that are the same as the system clock signal SCLK. The internal clock generator 141 may provide the system clock signal SCLK to the ramp generator 142 as the first to N-th clock signals without modification.

Figure 10:
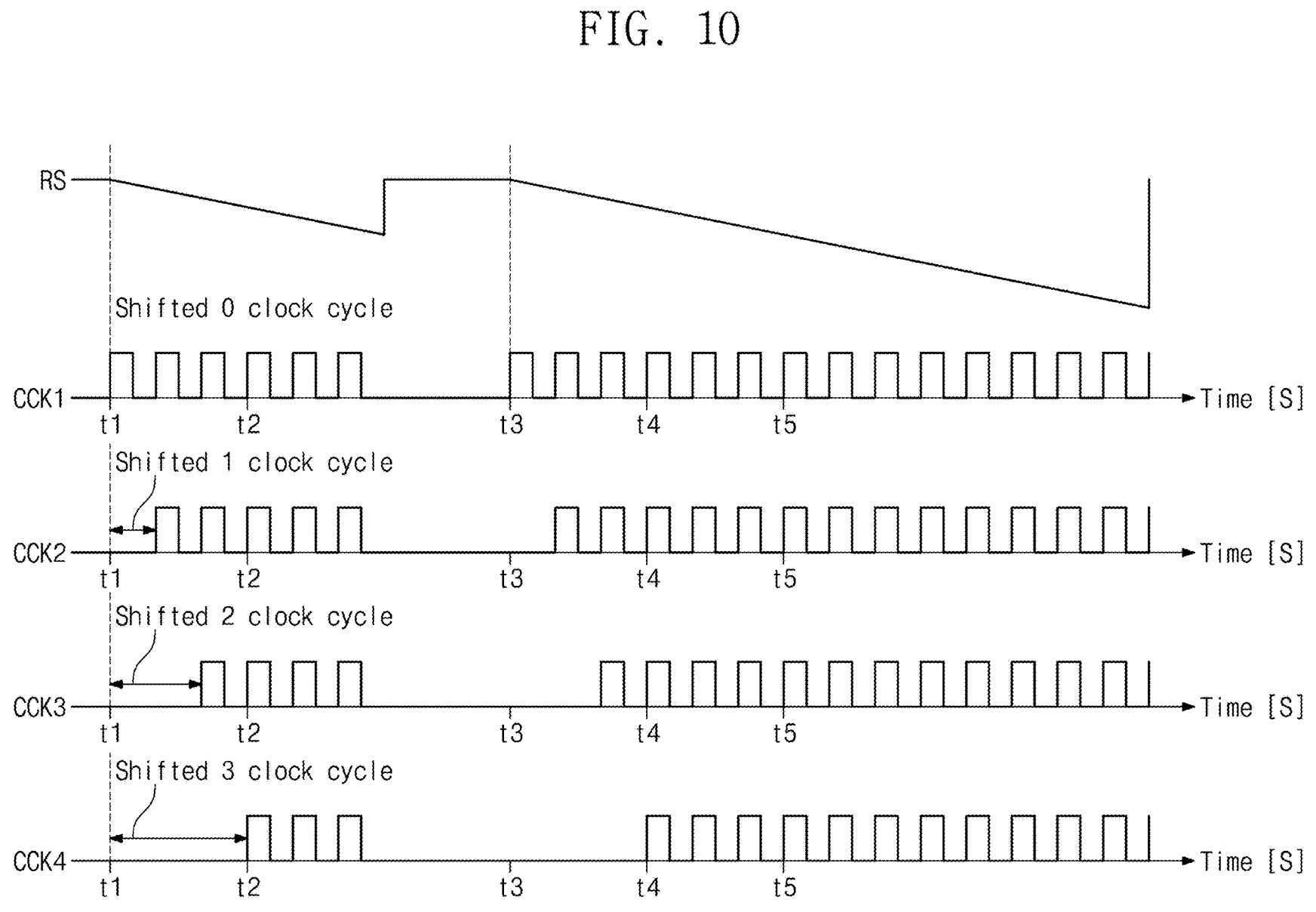

FIG. 10 is a timing diagram for describing the counter clock signal CCK and the ramp signal RS of an image sensor including the internal clock generator 141 of FIG. 9. Referring to FIG. 10, the ramp signal RS and counter clock signals CCK1 to CCK4 will be described under the condition that each of the (N+1)-th to 2N-th clock signals (e.g., counter system clock signals) is a masked system clock signal.

The ramp signal RS may be one of first to fourth ramp signals. The first to fourth ramp signals which respectively correspond to the first to fourth counter clock signals CCK1 to CCK4 may be the same as the ramp signal RS of FIG. 3.

A counter clock generator may receive the (N+1)-th to (N+4)-th clock signals from an internal clock generator. The counter clock generator may generate the first to fourth counter clock signals CCK1 to CCK4 respectively based on the (N+1)-th to (N+4)-th clock signals.

For convenience of description, below, the case where a set of the first to fourth numbers respectively corresponding to the first to fourth clock signals is {0, 1, 2, 3} will be described with reference to FIG. 10.

The first counter clock signal CCK1 may refer to a signal that is obtained by shifting the counter clock signal CCK corresponding to the ramp signal RS of FIG. 3 by a zero clock cycle of the system clock signal (e.g., without any shift). For example, the reset count corresponding to the first pixel signal, such as the pixel signal PIXOUT of FIG. 3 and the ramp signal RS, may be the same as the reset count of FIG. 3, in other words, equal to "3". Accordingly, because the DNL corresponding to the reset count of "3" is the third offset o3 in FIG. 4, the DNL corresponding to the first pixel signal may be the third offset o3.

The second counter clock signal CCK2 may refer to a signal that is obtained by shifting the counter clock signal CCK corresponding to the ramp signal RS of FIG. 3 by one clock cycle of the system clock signal. For example, the reset count corresponding to the second pixel signal, such as the pixel signal PIXOUT of FIG. 3 and the ramp signal RS, may be "2," which is smaller than the reset count of FIG. 3, i.e., "3," by "1". Accordingly, because the DNL corresponding to the reset count of "2" is the second offset o2 in FIG. 4, the DNL corresponding to the second pixel signal may be the second offset o2.

The third counter clock signal CCK3 may refer to a signal that is obtained by shifting the counter clock signal CCK corresponding to the ramp signal RS of FIG. 3 by two clock cycles of the system clock signal. For example, the reset count corresponding to the third pixel signal, such as the pixel signal PIXOUT of FIG. 3 and the ramp signal RS, may be "1," which is smaller than the reset count of FIG. 3, i.e., "3," by "2". Accordingly, because the DNL corresponding to the reset count of "1" is the first offset o1 in FIG. 4, the DNL corresponding to the third pixel signal may be the first offset o1.

The fourth counter clock signal CCK4 may refer to a signal that is obtained by shifting the counter clock signal CCK corresponding to the ramp signal RS of FIG. 4 by three clock cycles of the system clock signal. For example, the reset count corresponding to the fourth pixel signal, such as the pixel signal PIXOUT of FIG. 3 and the ramp signal RS, may be "0," which is smaller than the reset count of FIG. 3, i.e., "3," by "3". Accordingly, because the DNL corresponding to the reset count of "0" is the eighth offset o8 in FIG. 4, the DNL corresponding to the fourth pixel signal may be the eighth offset o8.

For convenience of description, FIG. 10 shows the first to fourth counter clock signals CCK to CCK4, but the remaining counter clock signals among the first to N-th counter clock signals may be respectively shifted as in the above description, and offsets of corresponding reset counts may be determined.

In the ADC circuit according to an embodiment of the present disclosure, as the degree of shifting the counter clock signal changes each time a different pixel row is driven, the reset counts and corresponding DNLs in a single pixel column may not be identically repeated. Accordingly, pattern noise (e.g., CFPN) in image data generated from the digital signals output from the ADC circuit may be reduced.

Figure 11:
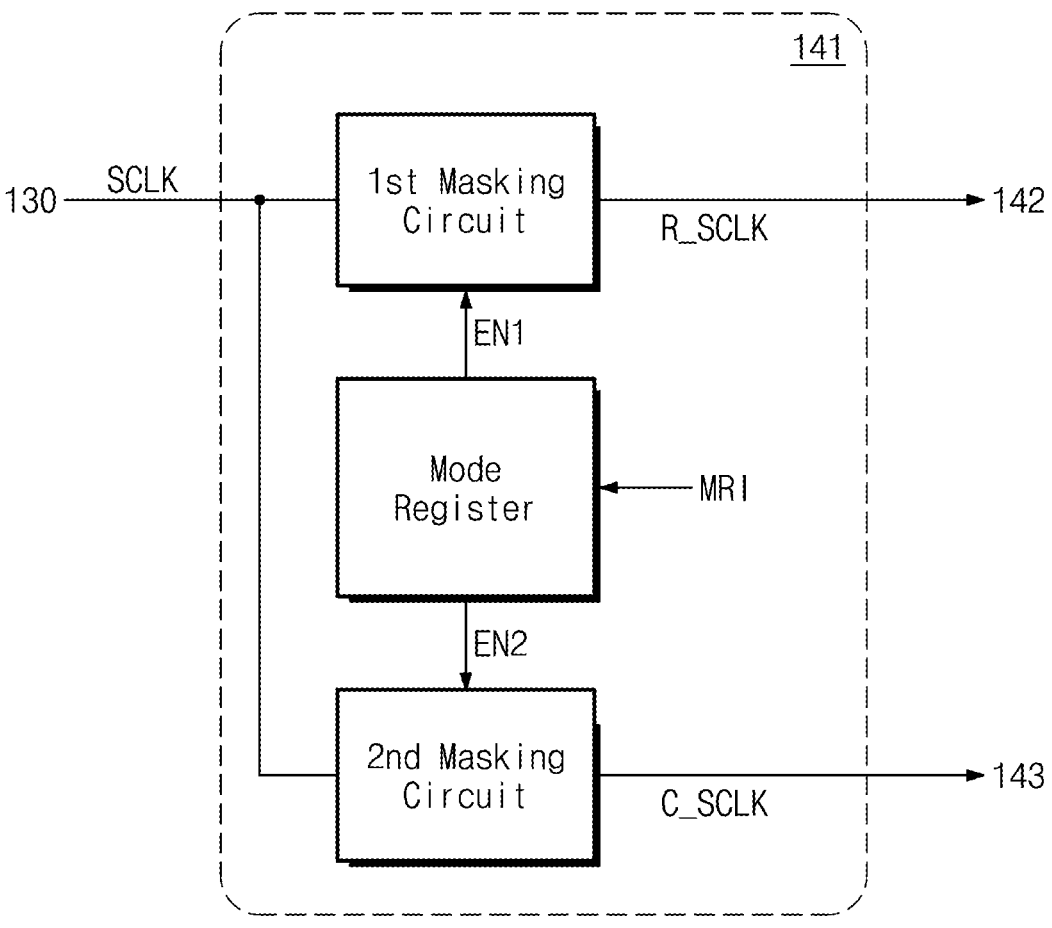
FIG. 11 is a block diagram of an internal clock generator according to some embodiments of the present disclosure.

FIG. 11 is a block diagram of the internal clock generator 141 according to some embodiments of the present disclosure. The internal clock generator 141, which includes a mode register and is configured to generate the ramp system clock signal R_SCLK or the counter system clock signal C_SCLK by masking a system clock signal by using the mode register, will be described with reference to FIG. 11.

The internal clock generator 141 may include a first masking circuit, a second masking circuit, and the mode register.

The first masking circuit may determine whether to mask the system clock signal SCLK based on a first enable signal EN1 received from the mode register.

For example, in response to the first enable signal EN1 having the first voltage level (e.g., the high voltage level), the first masking circuit may generate first to N-th clock signals by masking the system clock signal SCLK respectively by first to N-th clock cycles. In other words, an operation of the first masking circuit may be similar to the operation of the first masking circuit of FIG. 7. In contrast, in response to the first enable signal EN1 having the second voltage level (e.g., the low voltage level) different from the first voltage level, the first masking circuit may generate the first to N-th clock signals identical to the system clock signal SCLK.

The first masking circuit may provide the first to N-th clock signals to the ramp generator 142.

The second masking circuit may determine whether to mask the system clock signal SCLK based on a second enable signal EN2 received from the mode register.

For example, in response to the second enable signal EN2 having the first voltage level (e.g., the high voltage level), the second masking circuit may generate (N+1)-th to 2N-th clock signals by masking the system clock signal SCLK respectively by the first to N-th clock cycles. In other words, an operation of the second masking circuit may be similar to the operation of the second masking circuit of FIG. 9. However, when the second enable signal EN2 has the second voltage level (e.g., the low voltage level) different from the first voltage level, the second masking circuit may generate the (N+1)-th to 2N-th clock signals identical to the system clock signal SCLK.

The second masking circuit may provide the (N+1)-th to 2N-th clock signals to the counter clock generator 143.

The mode register may generate the first enable signal EN1 and the second enable signal EN2 based on mode register information MRI. The mode register information MRI may indicate either the shifting of the ramp signal or the shifting of the counter clock signal.

In some embodiments, the mode register information MRI may be determined in advance. The mode register information MRI may be received from the control circuit 130 of FIG. 1.

When the mode register information MRI indicates the shifting of the ramp signal, the mode register may generate the first enable signal EN1 with the first voltage level and the second enable signal EN2 with the second voltage level. Conversely, when the mode register information MRI indicates the shifting of the counter clock signal, the mode register may generate the first enable signal EN1 with the second voltage level and the second enable signal EN2 with the first voltage level.

FIG. 12 is a table for describing a DNL average of an ADC circuit according to some embodiments of the present disclosure. The DNLs and column average DNL DNLA corresponding to the first to N-th pixel signals PIXOUT1 to PIXOUTN respectively output from the pixel circuits connected to the first ADC of FIG. 1 will be described with reference to FIG. 12. The DNLs and column average DNL DNLA corresponding to the first to N-th pixel signals PIXOUT1 to PIXOUTN of FIG. 12 correspond to the DNLs and column average DNL DNLA corresponding to the first to N-th pixel signals PIXOUT1 to PIXOUTN of FIG. 5.

For ease of explanation, only some of the first to N-th numbers corresponding to the first to N-th clock cycles will be described below. However, the present disclosure is not limited thereto. For example, a set of the first to N-th numbers may be various as described with reference to FIG. 7.

First to third column average DNLs DNLA1 to DNLA3 may correspond to the cases where "N" and (2M−1) are equal to each other and the first to fourth numbers sequentially increase or decrease by one. In an embodiment, "M" may be the number of digital bits included in the digital signal DS which the first ADC outputs.

For example, when the DNL corresponding to the first pixel signal PIXOUT1 is the first offset o1, the DNL corresponding to the second pixel signal PIXOUT2 may be the second offset o2, the DNL corresponding to the third pixel signal PIXOUT3 may be the third offset o3, and the DNL corresponding to the N-th pixel signal PIXOUTN may be the N-th offset oN. The DNLs corresponding to the fourth to (N−1)-th pixel signals may respectively be the fourth to (N−1)-th offsets.

When the DNL corresponding to the first pixel signal PIXOUT1 is the second offset o2, the DNL corresponding to the second pixel signal PIXOUT2 may be the third offset o3, the DNL corresponding to the third pixel signal PIXOUT3 may be the fourth offset o4, and the DNL corresponding to the N-th pixel signal PIXOUTN may be the first offset o1. The DNLs corresponding to the fourth to (N−1)-th pixel signals may respectively be the fifth to N-th offsets.

When the DNL corresponding to the first pixel signal PIXOUT1 is the third offset o3, the DNL corresponding to the second pixel signal PIXOUT2 may be the fourth offset o4, the DNL corresponding to the third pixel signal PIXOUT3 may be the fifth offset o5, and the DNL corresponding to the N-th pixel signal PIXOUTN may be the second offset o2. The DNLs corresponding to the fourth to (N−1)-th pixel signals may respectively be the sixth and N-th offsets and the first offset o1.

In each of the cases where the DNL corresponding to the first pixel signal PIXOUT1 corresponds to the fourth to N-th offsets o4 to oN, respectively, the DNLS corresponding to the second to N-th pixel signals may be determined as described above.

The first column average DNL DNLA1 may indicate a column average DNL when the DNL corresponding to the first pixel signal PIXOUT1 is the first offset o1. The first column average DNL DNLA1 is o1+o2+o3+ . . . +oN/N. In this case, o1 to ON may be the first to N-th offsets, and "N" may be the number of pixel signals received from a pixel array. In other words, the first column average DNL DNLA1 may be obtained by dividing a sum of all the first to N-th offsets o1 to oN by "N". In the first column average DNL DNLA1, because all the DNLs are added, the positive and negative offsets may cancel each other out. Consequently, according to the present disclosure, the column average DNL may decrease, or the pattern noise (e.g., CFPN) that results from the same DNL being repeated across rows may decrease.

The second column average DNL DNLA2 may indicate a column average DNL when the DNL corresponding to the first pixel signal PIXOUT1 is the second offset o2. The third column average DNL DNLA3 may indicate a column average DNL when the DNL corresponding to the first pixel signal PIXOUT1 is the third offset o3. In this case, each of the second column average DNL DNLA2 and the third column average DNL DNLA3 may be o1+o2+o3+ . . . +oN/N, in other words, may be the same as the first column average DNL DNLA1.

According to an embodiment of the present disclosure, an ADC circuit masking a system clock signal and an image sensor including the same are provided.

Additionally, the differential non-linearities for pixel circuits located in the same column are not identically repeated by masking the system clock signal such that the masked clock period of the system clock signal changes whenever a different pixel row is driven, and by shifting the ramp signal or counter clock signal using the masked clock signal. As a result, pattern noise in the image sensor may be reduced.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An image sensor comprising:
a pixel array including first to N-th pixel circuits configured to respectively generate first to N-th pixel signals;
a row decoder configured to sequentially drive the first to N-th pixel circuits;
a first analog-to-digital converter (ADC) connected to the first to N-th pixel circuits through a first column line;
a system clock generator configured to generate a system clock signal;
an internal clock generator configured to generate first to N-th clock signals and (N+1)-th to 2N-th clock signals based on the system clock signal;
a ramp generator configured to generate first to N-th ramp signals respectively based on the first to N-th clock signals; and
a counter clock generator configured to generate first to N-th counter clock signals respectively based on the (N+1)-th to 2N-th clock signals,
wherein the first ADC includes:
a first comparator configured to generate first to N-th comparison signals based on comparison operations of the first to N-th pixel signals and the first to N-th ramp signals; and
a first counter configured to generate first to N-th digital signals based on the first to N-th comparison signals and the first to N-th counter clock signals,
wherein the internal clock generator is further configured to:
in synchronization with the sequential driving of the first to N-th pixel circuits by the row decoder, sequentially generate the first to N-th clock signals by masking the system clock signal respectively for first to N-th clock cycles, and sequentially generate the (N+1)-th to 2N-th clock signals that are identical to the system clock signal; or
in synchronization with the sequential driving of the first to N-th pixel circuits by the row decoder, sequentially generate the first to N-th clock signals that are identical to the system clock signal, and sequentially generate the (N+1)-th to 2N-th clock signals by masking the system clock signal respectively for the first to N-th clock cycles, and
wherein "N" is an integer of 2 or more.

2. The image sensor of claim 1, wherein the internal clock generator includes:
a first masking circuit configured to generate the first to N-th clock signals by masking the system clock signal respectively for the first to N-th clock cycles and to output the first to N-th clock signals to the ramp generator.

3. The image sensor of claim 1, wherein the internal clock generator includes:
a second masking circuit configured to generate the (N+1)-th to 2N-th clock signals by masking the system clock signal respectively for the first to N-th clock cycles and to output the (N+1)-th to 2N-th clock signals to the counter clock generator.

4. The image sensor of claim 1, wherein the internal clock generator includes:
a mode register configured to generate a first enable signal with a first voltage level and a second enable signal with a second voltage level different from the first voltage level or to generate a first enable signal with the second voltage level and a second enable signal with the first voltage level;
a first masking circuit configured to generate the first to N-th clock signals by masking the system clock signal respectively for the first to N-th clock cycles, when receiving the first enable signal with the first voltage level; and
a second masking circuit configured to generate the (N+1)-th to 2N-th clock signals by masking the system clock signal respectively for the first to N-th clock cycles, when receiving the second enable signal with the first voltage level.

5. The image sensor of claim 1, wherein the pixel array further includes:
(N+1)-th to 2N-th pixel circuits configured to generate (N+1)-th to 2N-th pixel signals,
wherein the image sensor further comprises:
a second ADC connected to the (N+1)-th to 2N-th pixel circuits through a second column line, and
wherein the second ADC includes:
a second comparator configured to generate (N+1)-th to 2N-th comparison signals based on comparison operations of the (N+1)-th to 2N-th pixel signals and the first to N-th ramp signals; and
a second counter configured to generate (N+1)-th to 2N-th digital signals based on the (N+1)-th to 2N-th comparison signals and the first to N-th counter clock signals.

6. The image sensor of claim 1, wherein each of the first to N-th clock cycles corresponds to an integer multiple of a clock cycle of the system clock signal, and
wherein the integer multiple is not negative.

7. The image sensor of claim 6, wherein the internal clock generator includes:
a random number generator configured to generate first to N-th numbers,
wherein the first to N-th clock cycles correspond to values obtained by multiplying the first to N-th numbers and the clock cycle of the system clock signal, respectively, and
wherein each of the first to N-th numbers is non-negative integer.

8. The image sensor of claim 1, wherein, when the row decoder drives a first pixel circuit among the first to N-th pixel circuits, wherein the internal clock generator is configured to:

generate the first clock signal by masking the system clock signal for the first clock cycle and generate the (N+1)-th clock signal that is identical to the system clock signal; or generate the first clock signal that is identical to the system clock signal and generate the (N+1)-th clock signal by masking the system clock signal for the first clock cycle, wherein the comparator is configured to generate a first comparison signal based on a comparison operation of the first ramp signal based on the first clock signal and the first pixel signal, and wherein the counter is configured to generate the first digital signal based on the first counter clock signal based on the (N+1)-th clock signal and the first comparison signal.

9. The image sensor of claim 1, wherein the first comparator is further configured to:

generate the first comparison signal having a first voltage level during an interval when the first pixel signal exceeds the first ramp signal and having a second voltage level different from the first voltage level during an interval when the first pixel signal is equal to or less than the first ramp signal.

10. The image sensor of claim 9, wherein the first counter is further configured to:

generate the first digital signal based on the number of pulses of the first counter clock signal occurring in an interval when the first comparison signal has the second voltage level.

11. An image sensor comprising:

a pixel array including a plurality of pixel circuits disposed at a plurality of rows and a plurality of columns;

a row decoder configured to sequentially drive the plurality of rows;

a system clock generator configured to generate a system clock signal;

an internal clock generator configured to generate a ramp system clock signal and a counter system clock signal based on the system clock signal;

a ramp generator configured to generate a ramp signal based on the ramp system clock signal;

a counter clock generator configured to generate a counter clock signal based on the counter system clock signal; and a first analog-to-digital converter (ADC) connected to pixel circuits, which are located at a first column among the plurality of columns, from among the plurality of pixel circuits through a first column line;

wherein the first ADC includes:

a first comparator configured to generate a comparison signal based on a comparison operation of a pixel signal received through the first column line and the ramp signal; and a first counter configured to generate a digital signal based on the comparison signal and the counter clock signal, wherein the internal clock generator is configured to:

generate the ramp system clock signal by masking the system clock signal for a target clock cycle and generate the counter system clock signal that is identical to the system clock signal; or

24 generate the ramp system clock signal that is identical to the system clock signal and generate the counter system clock signal by masking the system clock signal for the target clock cycle, and wherein the target clock cycle changes each time a row driven by the row decoder from the plurality of rows, changes.

12. The image sensor of claim 11, wherein the internal clock generator includes:

a first masking circuit configured to generate the ramp system clock signal by masking the system clock signal for the target clock cycle and to output the ramp system clock signal to the ramp generator.

13. The image sensor of claim 11, wherein the internal clock generator includes:

a second masking circuit configured to generate the counter system clock signal by masking the system clock signal for the target clock cycle and to output the counter system clock signal to the counter clock generator.

14. The image sensor of claim 11, wherein the internal clock generator includes:

a mode register configured to generate a first enable signal with a first voltage level and a second enable signal with a second voltage level different from the first voltage level or to generate a first enable signal with the second voltage level and a second enable signal with the first voltage level;

a first masking circuit configured to generate the ramp system clock signal by masking the system clock signal for the target clock cycle, when receiving the first enable signal with the first voltage level; and a second masking circuit configured to generate the counter system clock signal by masking the system clock signal for the target clock cycle, when receiving the second enable signal with the first voltage level.

15. The image sensor of claim 11, wherein the target clock cycle is an integer multiple of the system clock signal, and the integer multiple is not negative.

16. The image sensor of claim 11, wherein the internal clock generator includes:

a random number generator configured to generate first to N-th numbers, and wherein the internal clock generator is further configured to sequentially generate first to N-th clock cycles by multiplying the first to N-th numbers and a clock cycle of the system clock signal, respectively, as the target clock cycle.

17. The image sensor of claim 11, wherein the first comparator is further configured to:

generate the comparison signal having a first voltage level during an interval when the pixel signal exceeds a reference voltage level and having a second voltage level smaller than the first voltage level during an interval when the pixel signal is equal to or smaller than the reference voltage level.

18. The image sensor of claim 17, wherein the first counter is further configured to:

generate the digital signal based on the number of pulses of the counter clock signal occurring in an interval when the comparison signal has the second voltage level.

19. An analog-to-digital converter (ADC) circuit which is connected to first to N-th pixel circuits and a system clock generator, comprising:

an internal clock generator configured to generate first to N-th clock signals and (N+1)-th to 2N-th clock signals based on a system clock signal received from the system clock generator;

a ramp generator configured to generate first to N-th ramp signals respectively based on the first to N-th clock signals;

a counter clock generator configured to generate first to N-th counter clock signals respectively based on the (N+1)-th to 2N-th clock signals; and a first ADC connected to the first to N-th pixel circuits through a first column line, wherein the first ADC includes:

a first comparator configured to generate first to N-th comparison signals based on comparison operations of first to N-th pixel signals respectively received from the first to N-th pixel circuits and the first to N-th ramp signals; and a first counter configured to generate first to N-th digital signals based on the first to N-th comparison signals and the first to N-th counter clock signals, wherein the internal clock generator is further configured to:

in synchronization with the sequential driving of the first to N-th pixel circuits, sequentially generate the first to N-th clock signals by masking the system clock signal respectively for first to N-th clock cycles and sequentially generate the (N+1)-th to 2N-th clock signals that are identical to the system clock signal; or in synchronization with the sequential driving of the first to N-th pixel circuits, sequentially generate the first to N-th clock signals that are identical to the system clock signal and sequentially generate the (N+1)-th to 2N-th clock signals by masking the system clock signal respectively for the first to N-th clock cycles, and wherein "N" is an integer greater than or equal to 2.

20. The ADC circuit of claim 19, wherein, when the first pixel circuit is driven, the internal clock generator is configured to:

generate the first clock signal by masking the system clock signal for the first clock cycle and generate the (N+1)-th clock signal that is identical to the system clock signal; or generate the first clock signal that is identical to the system clock signal and generate the (N+1)-th clock signal by masking the system clock signal for the first clock cycle, wherein the first comparator is configured to generate a first comparison signal based on a comparison operation of the first ramp signal based on the first clock signal and the first pixel signal, and wherein the first counter is configured to generate the first digital signal based on the first counter clock signal based on the (N+1)-th clock signal and the first comparison signal.

* * * * *